US012751275B2

(12) United States Patent
Zhu

(10) Patent No.: US 12,751,275 B2
(45) Date of Patent: Sep. 29, 2026

(54) METALLIZATION STACK AND METHOD OF MANUFACTURING THE SAME, AND ELECTRONIC DEVICE INCLUDING METALLIZATION STACK

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 294 days.

(21) Appl. No.: 18/300,719

(22) Filed: Apr. 14, 2023

(65) Prior Publication Data

US 2023/0253316 A1 Aug. 10, 2023

Related U.S. Application Data

(63) Continuation of application No. 17/782,928, filed as application No. PCT/CN2020/126987 on Nov. 6, 2020.

(30) Foreign Application Priority Data

Dec. 6, 2019 (CN) ........................ 201911254611.8

(51) Int. Cl.
*H01L 23/528* (2006.01)
*H01L 23/522* (2006.01)
(Continued)

(52) U.S. Cl.
CPC ......... *H10W 20/43* (2026.01); *H10W 20/038* (2026.01); *H10W 20/063* (2026.01);
(Continued)

(58) Field of Classification Search
CPC ..................... H01L 24/20; H01L 24/19; H01L 2224/02333; H01L 2224/0231;
(Continued)

(56) References Cited

U.S. PATENT DOCUMENTS

2002/0155693 A1 10/2002 Hong et al.
2004/0232555 A1* 11/2004 Komatsubara ...... H01L 23/5283 257/E23.152

(Continued)

FOREIGN PATENT DOCUMENTS

CN 103871964 * 6/2014 ....... H01L 23/53295
CN 103871964 A 6/2014
CN 110970379 A 4/2020

OTHER PUBLICATIONS

International Search Report issued in International Application No. PCT/CN2020/126987 dated Jan. 29, 2021 (2 pages).

(Continued)

*Primary Examiner* — Galina G Yushina
(74) *Attorney, Agent, or Firm* — Osha Bergman Watanabe & Burton LLP

(57) ABSTRACT

The metallization stack includes a via hole layer including a via hole and an upper interconnection line layer including an upper interconnection line on a substrate. The via hole layer is closer to the substrate than the upper interconnection line layer, a part of the upper interconnection line extends in a first direction, and a sidewall of the part of the upper interconnection line in the first direction is substantially coplanar with an upper portion of a corresponding sidewall of the via hole. The metallization stack further includes: a lower interconnection line layer closer to the substrate than the via hole layer, a part of a lower interconnection line in the lower interconnection line layer extends along a second direction, and a sidewall of the part of the lower interconnection line in the second direction is substantially coplanar with a lower portion of a corresponding sidewall of the via hole under the at least part of the upper interconnection line.

8 Claims, 27 Drawing Sheets

(51) Int. Cl.

| | |
|---|---|
| ***H01L 23/532*** | (2006.01) |
| ***H10W 20/00*** | (2026.01) |
| ***H10W 20/42*** | (2026.01) |
| ***H10W 20/43*** | (2026.01) |
| ***H10W 20/44*** | (2026.01) |
| ***H10W 20/46*** | (2026.01) |
| ***H10W 20/48*** | (2026.01) |
| *H01L 21/768* | (2006.01) |

(52) U.S. Cl.
CPC ....... *H10W 20/071* (2026.01); *H10W 20/072* (2026.01); *H10W 20/42* (2026.01); *H10W 20/46* (2026.01); *H10W 20/4403* (2026.01); *H10W 20/4432* (2026.01); *H10W 20/4441* (2026.01); *H10W 20/48* (2026.01)

(58) Field of Classification Search
CPC ............. H01L 21/76801; H01L 21/682; H01L 21/7685; H01L 21/76816; H01L 21/76847; H01L 21/76805; H01L 23/528; H01L 23/5226; H01L 23/53209; H01L 23/53257; H01L 23/53242; H01L 23/5329; H01L 23/481; H10W 20/43; H10W 20/038; H10W 20/063; H10W 20/071; H10W 20/072; H10W 20/46; H10W 20/4403; H10W 20/4432; H10W 20/4441; H10W 20/48
See application file for complete search history.

(56) References Cited

U.S. PATENT DOCUMENTS

| | | | | |
|---|---|---|---|---|
| 2006/0275622 | A1* | 12/2006 | Kim | H01L 23/528 428/615 |
| 2009/0230507 | A1* | 9/2009 | Riess | H01L 23/5223 257/532 |
| 2011/0147059 | A1* | 6/2011 | Ma | H01L 24/73 156/60 |
| 2015/0056800 | A1 | 2/2015 | Mebarki et al. | |
| 2017/0178981 | A1* | 6/2017 | Lam | H01L 23/528 |
| 2019/0067131 | A1* | 2/2019 | Liaw | H01L 21/823871 |

OTHER PUBLICATIONS

Written Opinion issued in International Application No. PCT/CN2020/126987 dated Jan. 29, 2021 (5 pages).

* cited by examiner

METALLIZATION STACK AND METHOD OF MANUFACTURING THE SAME, AND ELECTRONIC DEVICE INCLUDING METALLIZATION STACK

CROSS REFERENCE TO RELATED APPLICATION(S)

This application is Continuation Application of U.S. application Ser. No. 17/782,928, filed Jul. 6, 2022, which is a Section 371 National Stage Application of International Application No. PCT/CN2020/126987, filed on Nov. 6, 2020, which claims priority to Chinese Patent Application No. 201911254611.8 entitled "METALLIZATION STACK AND METHOD OF MANUFACTURING THE SAME, AND ELECTRONIC DEVICE INCLUDING METALLIZATION STACK" filed on Dec. 6, 2019, the content of which is incorporated herein by reference.

TECHNICAL FIELD

The present disclosure relates to a field of semiconductors, and in particular to a metallization stack and a method of manufacturing the same, and an electronic device including the metallization stack.

BACKGROUND

With increasing miniaturization of semiconductor devices, it is increasingly difficult to fabricate a high density interconnection structure because of the need for an extremely fine metal wire (which means a small grain size, an excessive barrier layer thickness and a resulting large resistance) and extremely small line spacing (which means misalignment, and difficulty in filling a contact hole). In addition, it is difficult to align a metal wire with a via hole, which may cause a short or open failure in an Integrated Circuit (IC) and thus increase manufacturing cost of the IC.

SUMMARY

In view of this, an object of the present disclosure is, at least in part, to provide a metallization stack and a method of manufacturing the same, and an electronic device including the metallization stack.

According to an aspect of the present disclosure, a metallization stack is provided, and the metallization stack includes at least one interconnection line layer and at least one via hole layer arranged alternately on a substrate, wherein at least one pair of adjacent an upper interconnection line layer and a via hole layer in the metallization stack includes: an upper interconnection line in the upper interconnection line layer; and a via hole in the via hole layer, wherein the via hole layer is arranged closer to the substrate than the upper interconnection line layer, wherein at least part of the upper interconnection line extends longitudinally in a first direction, and a sidewall of the at least part of the upper interconnection line in the first direction is substantially coplanar with at least an upper portion of a corresponding sidewall of the via hole under the at least part of the upper interconnection line, wherein the metallization stack further includes: a lower interconnection line layer that is closer to the substrate than the via hole layer and adjacent to the via hole layer, and wherein a part of a lower interconnection line in the lower interconnection line layer at least under the via hole extends longitudinally along a second direction intersecting the first direction, and a sidewall of the part of the lower interconnection line in the second direction is substantially coplanar with a lower portion of a corresponding sidewall of the via hole.

According to another aspect of the present disclosure, a method of manufacturing a metallization stack is provided. The metallization stack includes at least one interconnection line layer and at least one via hole layer arranged alternately. The method includes forming at least one pair of adjacent interconnection line layer and via hole layer in the metallization stack by: forming a first metal layer on a lower layer; forming a second metal layer on a first metal layer; patterning the first metal layer and the second metal layer into an interconnection pattern; and patterning the second metal layer into a separate portion to form the via hole.

According to another aspect of the present disclosure, an electronic device is provided, including the metallization stack described above.

BRIEF DESCRIPTION OF THE DRAWINGS

The above and other objectives, features and advantages of the present disclosure will be more apparent through the following description of embodiments of the present disclosure with reference to the accompanying drawings, in which:

FIG. 1 to FIG. 16 schematically show some stages in a process of manufacturing a metallization stack according to an embodiment of the present disclosure; and FIG. 17 to FIG. 24D schematically show some stages in a process of manufacturing a metallization stack according to another embodiment of the present disclosure, in which:

FIG. 3A, FIG. 7, FIG. 8A, FIG. 9, FIG. 10A, FIG. 11A, FIG. 14A, FIG. 18A, FIG. 21, FIG. 22A, FIG. 23 and FIG. 24A show top views, FIG. 1, FIG. 2, FIG. 10B, FIG. 11B, FIG. 12A, FIG. 14B, FIG. 15A, FIG. 15B, FIG. 16, FIG. 17 and FIG. 24B show cross-sectional views taken along a line AA', FIG. 3C, FIG. 4B, FIG. 5B, FIG. 8C, FIG. 10D, FIG. 11D, FIG. 12C, FIG. 13B, FIG. 14D, FIG. 18C, FIG. 19B, FIG. 20B, FIG. 22C and FIG. 24D show cross-sectional views taken along a line CC'.

Figure 1:
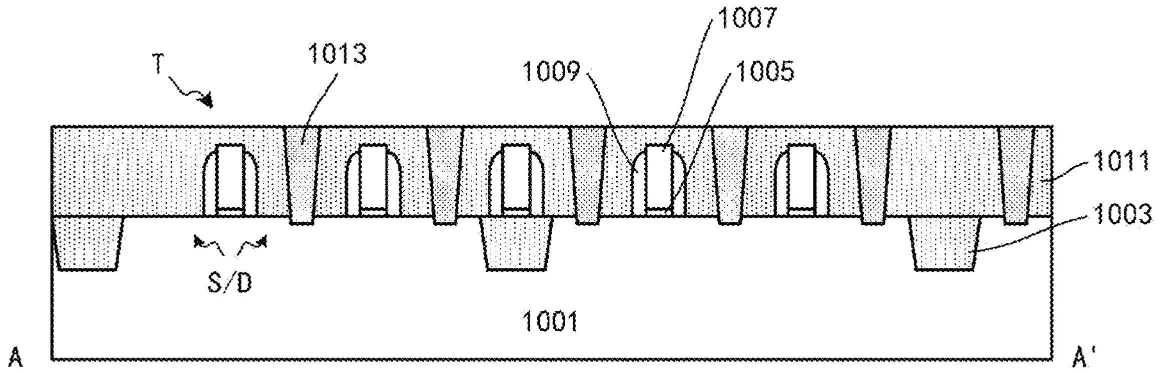

Throughout the drawings, the same or similar reference signs represent the same or similar components.

DETAILED DESCRIPTION OF EMBODIMENTS

Embodiments of the present disclosure will be described below with reference to the accompanying drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to the embodiments of the present disclosure are shown in the accompanying drawings. The figures are not drawn to scale. Some details are enlarged and some details may be omitted for clarity of presentation. The shapes of the various regions and layers as well as the relative size and positional relationship thereof shown in the figures are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being located "on" another layer/element, the layer/element may be located directly on the another layer/element, or there may be an intermediate layer/element between them. In addition, if a layer/element is located "on" another layer/element in one orientation, the layer/element may be located "under" the another layer/element when the orientation is reversed.

Embodiments of the present disclosure provide a method of manufacturing a metallization stack. Different from existing techniques in which an interlayer dielectric layer is formed first, then a trench or hole is formed in the interlayer dielectric layer, and the trench or hole is filled with a conductive material to form an interconnection line or via hole, according to an embodiment of the present disclosure, a metal pattern may be formed first on a lower layer (e.g., a substrate on which a device is formed or a next layer in the metallization stack), and then a dielectric material is filled into a gap of the metal pattern to form the interlayer dielectric layer. The metal pattern may be formed by photolithography. Accordingly, a line width and a spacing of the interconnection line and a critical dimension (CD) and a spacing of the via hole may be determined by a line width or CD and a spacing of photolithography, such that the line width or CD and the spacing may be reduced, and thus an integration density may be increased. In addition, a difficult problem of metal filling in an existing process is avoided. Further, since a filling process is not used, a metal material such as ruthenium (Ru), molybdenum (Mo), rhodium (Rh), platinum (Pt), iridium (Ir), nickel (Ni), cobalt (Co), or chromium (Cr) may be used, and thus a diffusion barrier layer may not be necessary.

In addition, in the existing process, a trench or hole formed by etching has a shape tapered from top to down, and then an interconnection line or a via hole formed therein has a corresponding shape. In contrast, according to an embodiment of the present disclosure, the interconnection line or via hole may be directly obtained by photolithography, and thus may have a shape tapered from bottom to top.

According to an embodiment of the present disclosure, a pair of an interconnection line layer and a via hole layer adjacent to each other may be formed together. For example, a first metal layer used for the interconnection line layer and a second metal layer used for the via hole layer may be formed on the lower layer. The first metal layer and the second metal layer may be formed sequentially over an entire region where the metallization stack needs to be formed, e.g. over substantially an entire surface of the lower layer. The first metal layer and the second metal layer may be patterned, for example, into an interconnect pattern by photolithography, where the interconnect pattern may correspond to or be a layout of the interconnection line in the interconnection line layer. The second metal layer with the interconnect pattern may be patterned into a separate portion to form the via hole. In addition, the interconnection line may be formed by the first metal layer (possibly cut off at some regions) with the interconnect pattern. Thus, the interconnection line and the via hole thereon may be self-aligned to each other.

A spacer layer may be disposed between the first metal layer and the second metal layer. For example, the spacer layer may serve as an etch stop layer (to optimize a manufacturing process, especially an etching process therein) and/or a diffusion barrier layer (which improves an interconnection performance). The spacer layer may be patterned into an interconnect pattern together with the first metal layer and the second metal layer.

The metallization stack may include a plurality of the interconnection line layers and via hole layers, wherein at least part or even all of the interconnection line layers and via hole layers may be manufactured in this way.

According to an embodiment of the present disclosure, the interconnect pattern may include a series of metal wires. These metal wires may have the same pattern as the layout of the interconnection line in the interconnection line layer. That is, the metal layer may be patterned according to the layout of the interconnection line. Alternatively, the interconnect pattern may have a pattern in which the metal wires extend according to the layout of the interconnection line, and the metal wires corresponding to separate interconnection lines arranged opposite to each other may extend continuously. In this case, it is advantageous to form the metal wires extending in the same direction for patterning. This layout may realize various interconnect routes by cooperating with metal wires extending in another direction that intersects (e.g., is orthogonal to) the direction in another interconnection line layer. For example, in the metallization stack, an interconnection line layer in which the interconnection line extends in a first direction and an interconnection line layer in which the interconnection line extends in a second direction orthogonal to the first direction may be alternately arranged in a vertical direction. After the second metal layer is patterned into the via hole, the metal wires formed by the first metal layer may be cut at a predetermined region according to the layout of the interconnection line so as to achieve separation between different interconnection lines.

In the above manufacturing process, a dielectric material may be filled, between the metal wires after the metal wires are formed, and in a space due to the removal of the second metal layer after the via hole is patterned, so as to form an interlayer dielectric layer. Since the gap between the metal wires or the above space is small, an air gap or void may be formed in the filled dielectric material. The air gap or void may help to reduce capacitance. The position of the air gap or void may be adjusted by a deposition-etch-deposition method, as described below. In addition, the dielectric material for each filling may be the same or different.

According to the above method, the metallization stack according to an embodiment of the present disclosure may be obtained. As described above, at least part of the interconnection line and the via hole thereon may be obtained by the first metal layer and the second metal layer, respectively, through a same photolithography process (and then subjected to further cutting processes to form the interconnection line and the via hole, respectively), and thus they may be self-aligned with each other, such that a sidewall of the via hole may not exceed a sidewall of the interconnection line below. For example, a sidewall of the at least part of the interconnection line in a longitudinal extension direction is substantially coplanar with at least a lower portion of a corresponding sidewall of the via hole.

The present disclosure may be presented in various forms, some examples of which will be described below. In the following description, a selection of various materials is involved. In the selection of materials, in addition to a function of the material (for example, a semiconductor material may be used to form the active region, a dielectric material may be used to form an electrical isolation, and a conductive material may be used to form the interconnection line and the via hole), the etching selectivity is also considered. In the following description, a required etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to the same etching formula.

FIGS. 1 to 16 schematically show some stages in a process of manufacturing a metallization stack according to an embodiment of the present disclosure.

As shown in FIG. 1, a substrate 1001 is provided. The substrate 1001 may be a substrate of various forms, including, but not limited to, a bulk semiconductor material substrate such as a bulk Si substrate, a semiconductor-on-insulator (SOI) substrate, a compound semiconductor substrate such as a SiGe substrate, and the like. The following description will be made by taking the bulk Si substrate as an example.

In the substrate 1001, an active region may be defined by an isolation portion 1003, such as a Shallow Trench Isolation (STI). For example, the isolation portion 1003 may surround various active regions. A semiconductor device T, such as a Metal Oxide Semiconductor Field Effect Transistor (MOSFET), a fin field effect transistor (FinFET), a nanowire field effect transistor, or the like, may be formed on various active regions. The semiconductor device T may have a gate stack including a gate dielectric layer 1005 and a gate electrode layer 1007 and source/drain regions S/D formed in the active region at both sides of the gate stack. A gate spacer 1009 may be formed on a sidewall of the gate stack. The semiconductor device T may be a planar device such as a MOSFET, or a cubic device such as a FinFET. In a case of a FinFET, the active region may be formed in a form of a fin protruding with respect to a substrate surface.

An interlayer dielectric layer 1011, such as an oxide (e.g., silicon oxide), may be formed on the substrate 1001 to cover various semiconductor devices T formed on the substrate 1001. In addition, a contact portion 1013 to various semiconductor devices T may be formed in the interlayer dielectric layer 1011. As shown in FIG. 1, a contact portion to the source/drain region S/D is shown, and a contact portion to the gate electrode layer 1007 may also be included (for example, see FIG. 3B).

Then, an interconnection structure or metallization stack may be fabricated on the substrate 1001.

Figure 2:
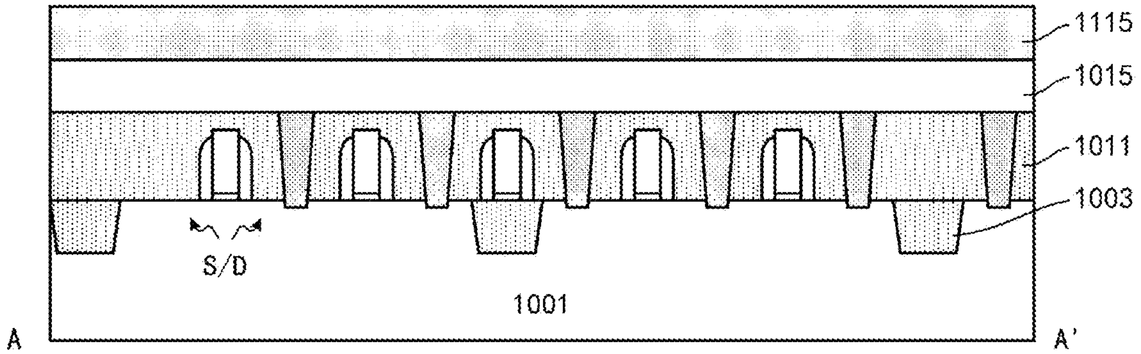

As shown in FIG. 2, a first metal layer 1015 used for a first interconnection line layer in the metallization stack and a second metal layer 1115 used for a first via hole layer in the metallization stack may be formed on the interlayer dielectric layer 1011 by, for example, deposition such as Physical Vapor Deposition (PVD), Chemical Vapor Deposition (CVD), Atomic Layer Deposition (ALD), or the like. For example, the first metal layer 1015 and the second metal layer 1115 may include a conductive metal such as ruthenium (Ru), molybdenum (Mo), rhodium (Rh), platinum (Pt), iridium (Ir), nickel (Ni), cobalt (Co), chromium (Cr), or the like. According to an embodiment, the first metal layer 1015 and the second metal layer 1115 may have a certain etching selectivity with respect to each other, e.g., the first metal layer 1015 and the second metal layer 1115 may include different materials. In an example, the first metal layer 1015 is a Ru layer and the second metal layer 1115 is a Mo layer. The first metal layer 1015 may have a thickness, for example, in a range of about 5 nm to 100 nm, for the first interconnection line layer; the second metal layer 1115 may have a thickness, for example, in a range of about 5 nm to 100 nm, for the first via hole layer.

According to an embodiment of the present disclosure, a Ru source may be purified by the following methods to obtain a high purity Ru metal. A gas stream including ozone ($O_3$) may be introduced into one or more reaction chambers to contact the Ru source, thereby forming ruthenium tetroxide ($RuO_4$) that is gaseous under the reaction condition. The ruthenium tetroxide, as well as unreacted ozone and remainder of the gas stream, may be fed to a collection chamber where the ruthenium tetroxide that is gaseous may be reduced to a ruthenium dioxide ($RuO_2$) layer on a semiconductor substrate. A deposited ruthenium dioxide may then be reduced, for example, with hydrogen, to produce a high purity Ru metal. In addition, ozone may be used as an etching gas to etch and pattern a deposited Ru metal layer.

Figure 3A:
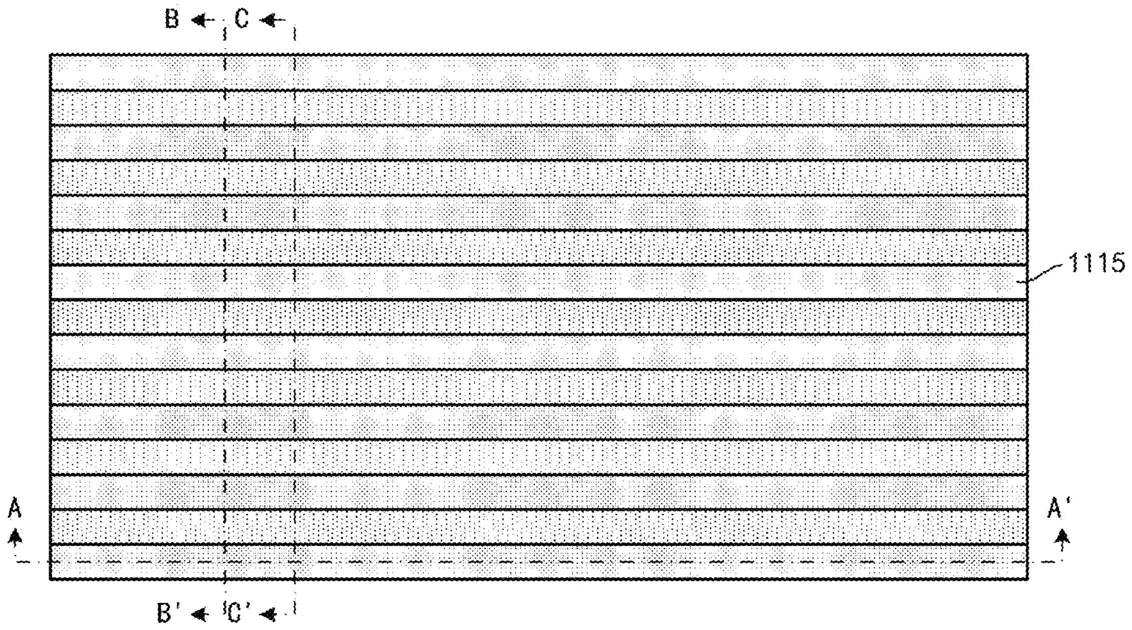
Figure 3B:
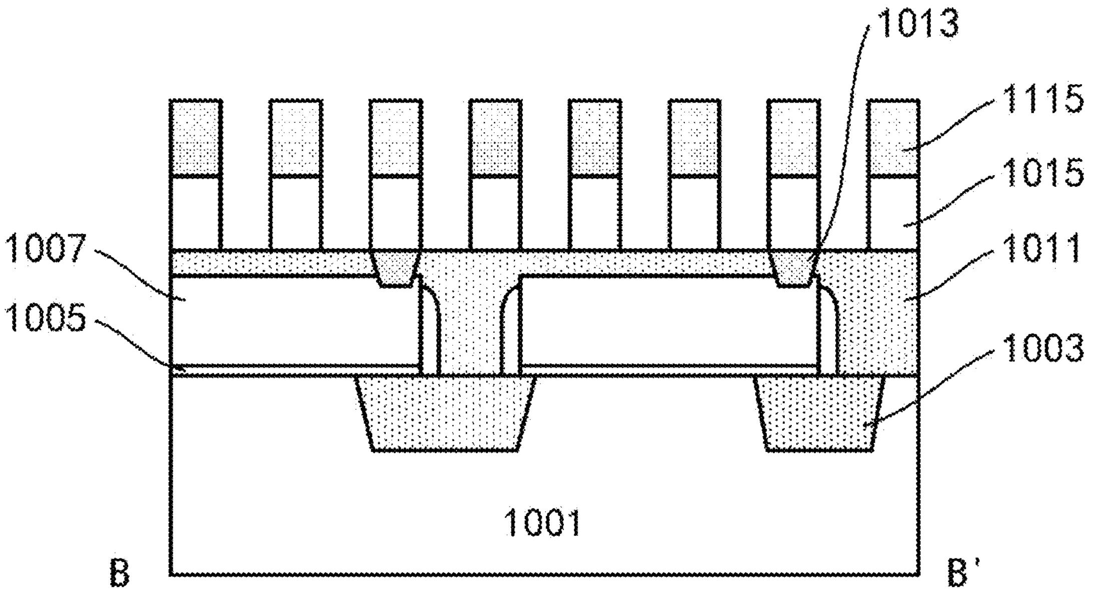
FIG. 3B, FIG. 4A, FIG. 5A, FIG. 8B, FIG. 10C, FIG. 11C, FIG. 12B, FIG. 13A, FIG. 14C, FIG. 18B, FIG. 19A, FIG. 20A, FIG. 22B and FIG. 24C show cross-sectional views taken along a line BB'.
Figure 3C:
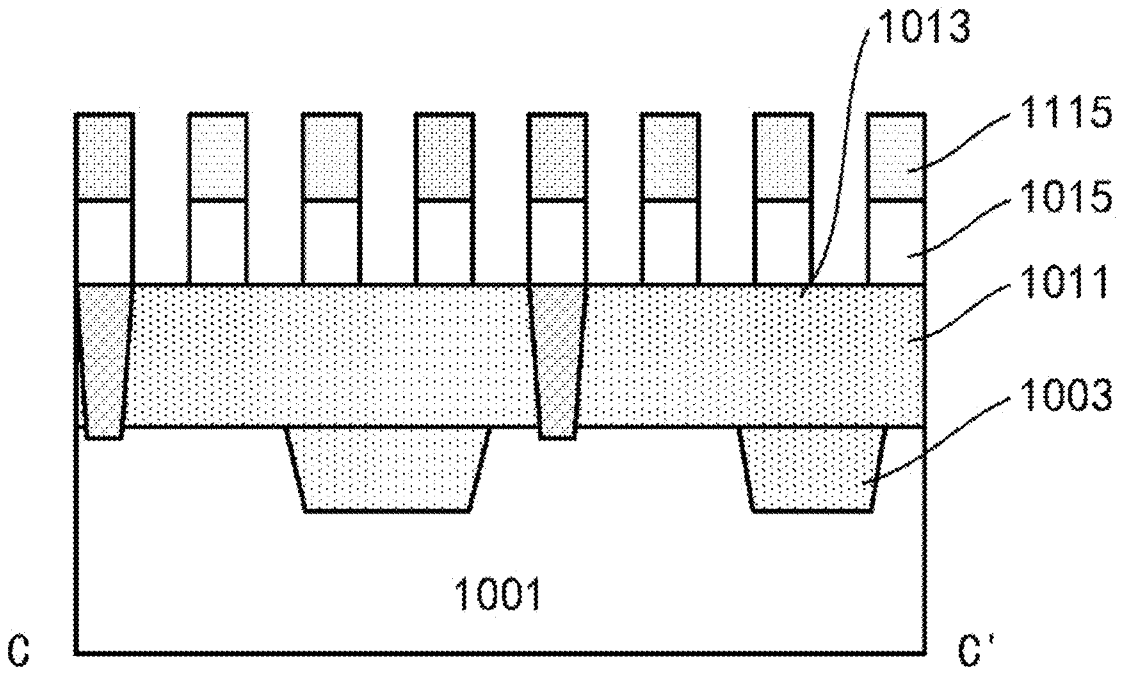

As shown in FIG. 3A to FIG. 3C, the first metal layer 1015 and the second metal layer 1115 may be patterned into a series of metal wires. Patterning may be performed by a photolithography process, for example, partition wall pattern transfer photolithography or Extreme Ultraviolet (EUV) photolithography, or the like. In photolithography, a Reactive Ion Etching (RIE) may be used, and the RIE may stop on the interlayer dielectric layer 1011 (or a contact portion 1013 therein) below the first metal layer 1015. A spacing between the metal wires may define a spacing between the interconnection lines in the first interconnection line layer, for example, between about 5 nm and 150 nm. In addition, in order to avoid excessive fluctuation in a density of patterns in the same layer between different regions, a dummy metal wire may be formed such that the metal wires are arranged at substantially uniform intervals, for example. A line width of the metal wire may define a line width of the interconnection line in the first interconnection line layer, for example, between about 5 nm and 100 nm. In addition, at least part of the metal wires may contact and be electrically connected to the contact portion 1013 below.

In this example, the formed metal wire extends substantially in parallel in a first direction (horizontal direction on a paper surface in FIG. 3A), and may be matched with a metal wire formed later that extends in a second direction that intersects (e.g., is perpendicular to) the first direction so as to achieve various interconnection routes. However, the present disclosure is not limited thereto. For example, different metal wires may extend in different directions, and the same metal wire may extend zigzag.

Figure 4A:
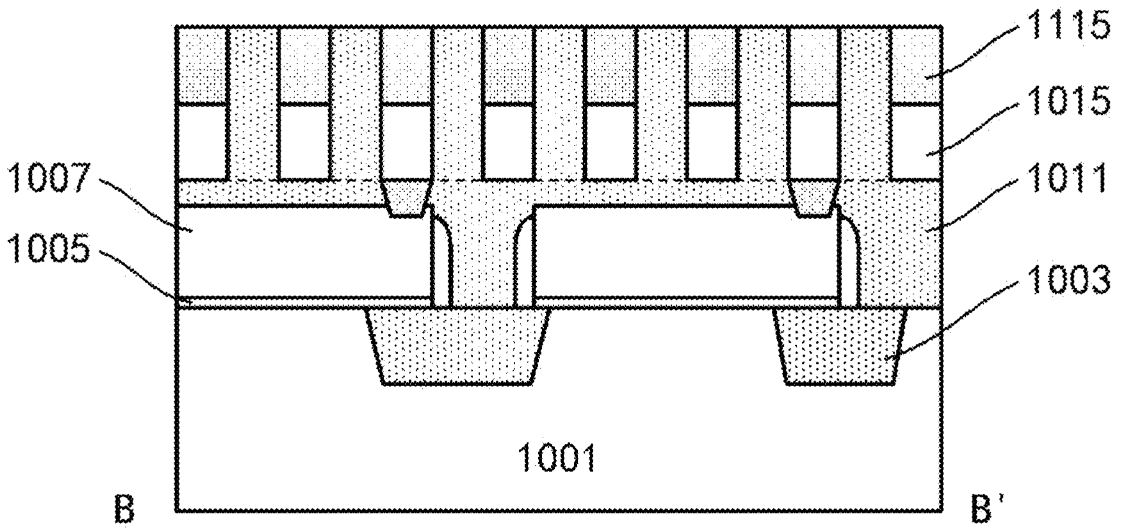
Figure 4B:
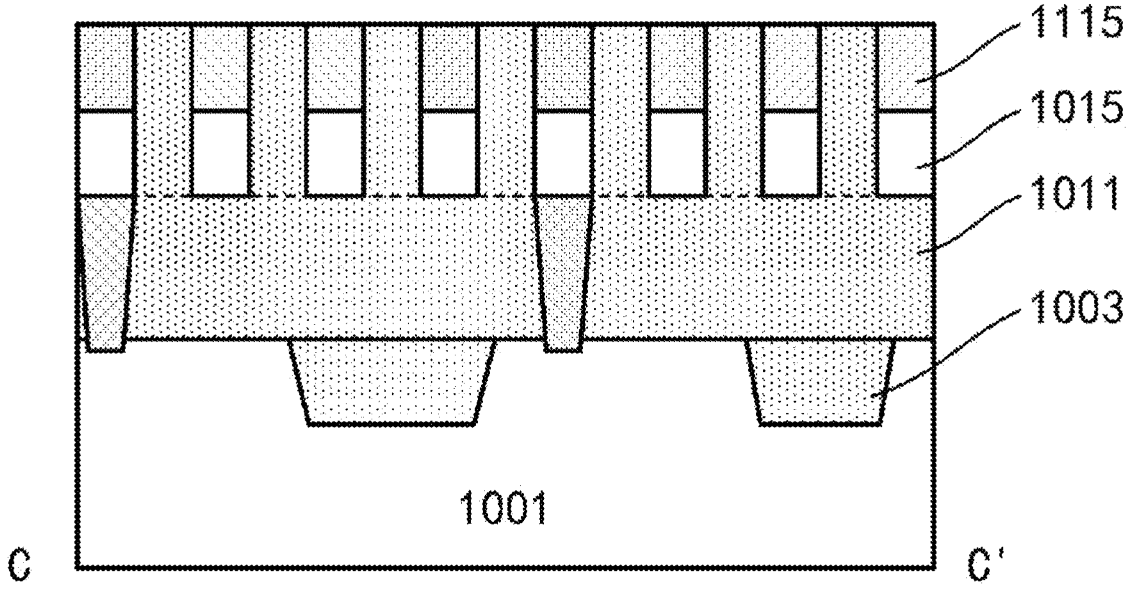

As shown in FIGS. 4A and 4B, an another interlayer dielectric layer may be formed on the interlayer dielectric layer 1011 to fill a gap between the metal wires 1015 and 1115. The another interlayer dielectric layer may include a dielectric material such as silicon oxide, silicon oxycarbide, other low-k dielectric materials, and the like. The another interlayer dielectric layer and a previous interlayer dielectric layer 1011 may include the same material, and thus they may be shown as 1011 as a whole, with a possible boundary therebetween schematically shown in a dashed line. Alternatively, the another interlayer dielectric layer and the previous interlayer dielectric layer 1011 may include different materials.

The another interlayer dielectric layer may be formed by depositing (e.g., CVD or ALD) a dielectric material to cover the metal wires 1015 and 1115, and then etching back or planarizing (e.g., Chemical Mechanical Polishing (CMP)) the deposited dielectric material and stopping on a top surface of the metal wires 1115. The etching back may use Atomic Layer Etching (ALE) to achieve good process control.

Figure 5A:
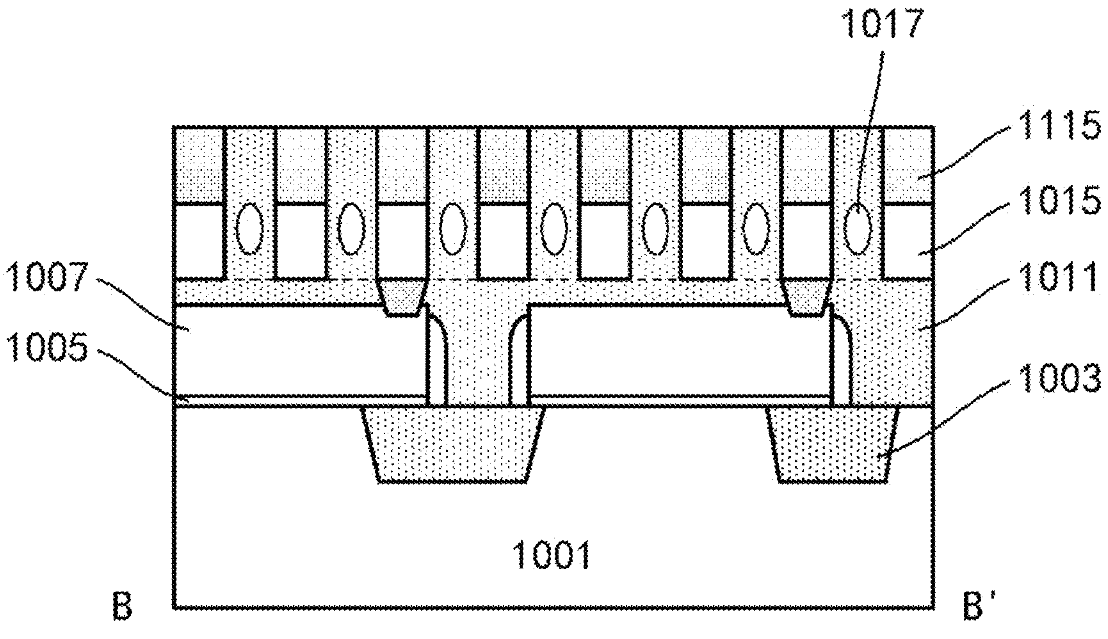
Figure 5B:
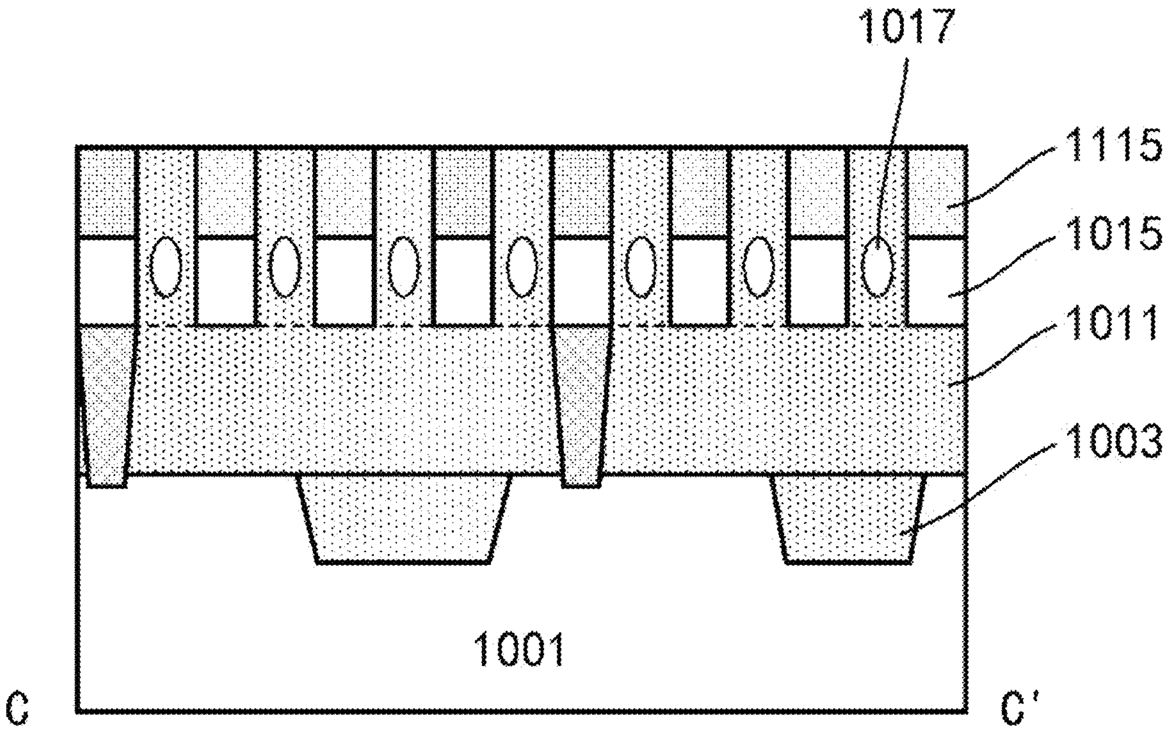

In the examples shown in FIGS. 4A and 4B, the deposited dielectric material completely fills a gap between the metal wires 1015 and 1115. However, the present disclosure is not limited thereto. As shown in FIGS. 5A and 5B, as a gap between metal wires 1015 is small, an air gap or void 1017 may be formed between the metal wires 1015 when the dielectric material is deposited, for example, when a CVD process is used. The air gap or void 1017 helps to reduce a capacitance between the metal wires.

According to an embodiment of the present disclosure, a position of the air gap or void 1017 in a vertical direction may be adjusted by adjusting a deposition process.

Figure 6A:
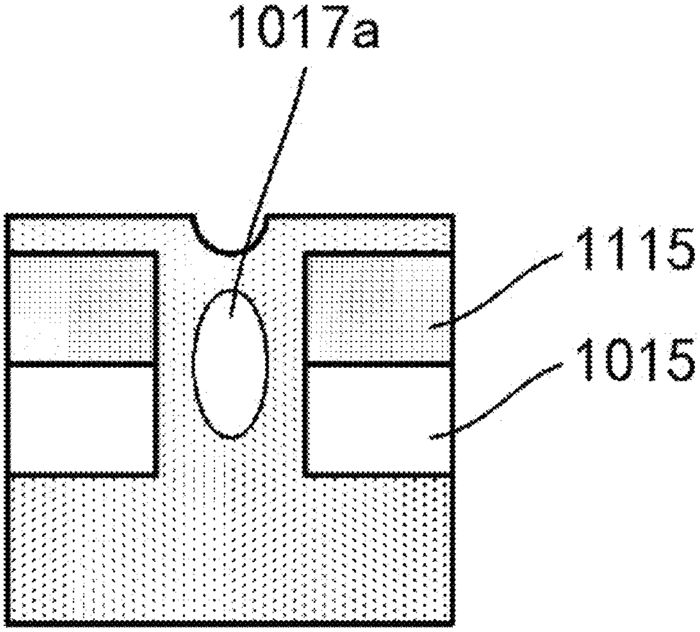
FIG. 6A to FIG. 6C show enlarged views of vicinity of a metal wire in a cross section along the BB 'line or CC' line.

For example, as shown in FIG. 6A, the dielectric material may be deposited into the gap between the metal wires 1015 and 1115 until the dielectric material closes a top portion of the gap. Multiple films (including the same or different materials) may be used during the deposition process. In this case, a formed air gap or void 1017*a* may be located approximately in the middle of the gap in the vertical direction.

Figure 6B:
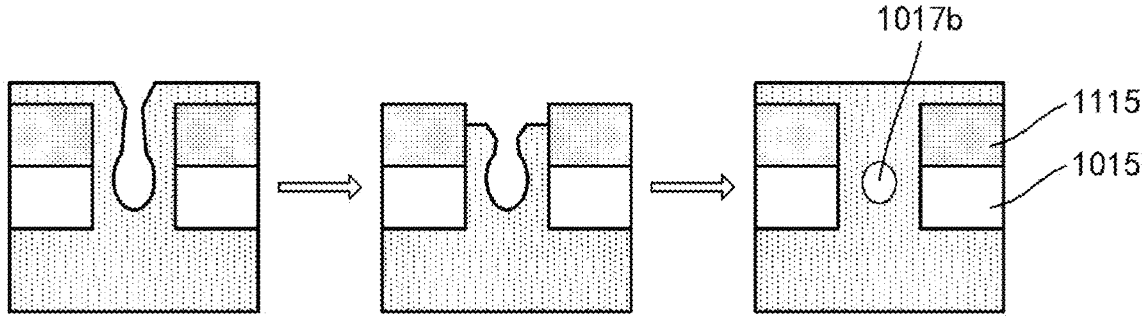

Alternatively, as shown in FIG. 6B, the dielectric material may be deposited into the gap between the metal wires 1015 and 1115 without closing the top portion of the gap. The deposited dielectric material may then be selectively etched, such as RIE, leaving a portion at the bottom portion of the gap, thereby enlarging an opening in the dielectric material. The dielectric material may then continue to be deposited until the dielectric material closes the top portion of the gap. The dielectric materials deposited twice may be the same or different. This deposition-etch-deposition process may be repeated multiple times. In this case, a formed air gap or void 1017*b* may be located at a lower portion of the gap in the vertical direction.

Figure 6C:
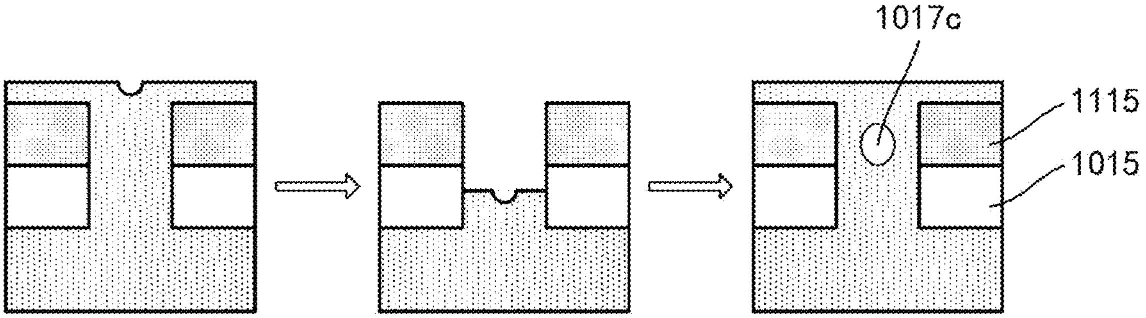

Alternatively, as shown in FIG. 6C, the dielectric material may be deposited into the gap between the metal wires 1015 until the dielectric material may completely fill the gap. The deposited dielectric material may then be selectively etched, such as RIE, leaving a portion at the bottom portion of the gap. The dielectric material may then continue to be deposited until the dielectric material closes the top portion of the gap. The dielectric materials deposited twice may be the same or different. This deposition-etch-deposition process may be repeated multiple times. In this case, a formed air gap or void 1017*c* may be located at an upper portion of the gap in the vertical direction.

As described above, the position of the air gap or void in the gap between the metal wires may be adjusted up and down by alternately performing deposition and etching.

Currently, a pattern of the second metal layer used for the first via hole layer is the same as a pattern (i.e., the metal wire pattern described above) of the first metal layer used for the first interconnection line layer. The second metal layer (currently in a form of a metal wire) used for the first via hole layer may be further patterned to form a via hole pattern.

Figure 7:
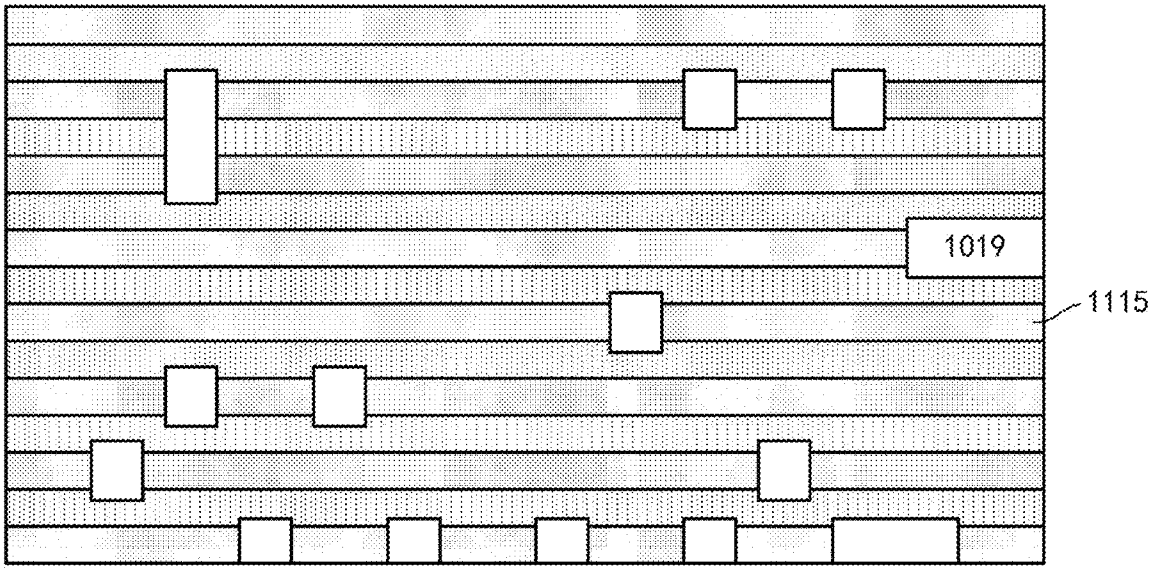

As shown in FIG. 7, a photoresist 1019 may be formed on the interlayer dielectric layer 1011 and the metal wire 1115, and the photoresist 1019 may be patterned (e.g., by exposure and development) to cover a region where the via hole is to be formed, and expose the remaining region.

A width W1 of the photoresist 1019 (a width of the via hole in the first via hole layer as defined thereby) (a dimension in a longitudinal extension direction of the metal wires, or in this example, a dimension in a horizontal direction on the paper in FIG. 7) may be relatively large, such that an interconnection line in a second interconnection line layer formed thereon may better land on the via hole so as to better contact the via hole.

Figure 8A:
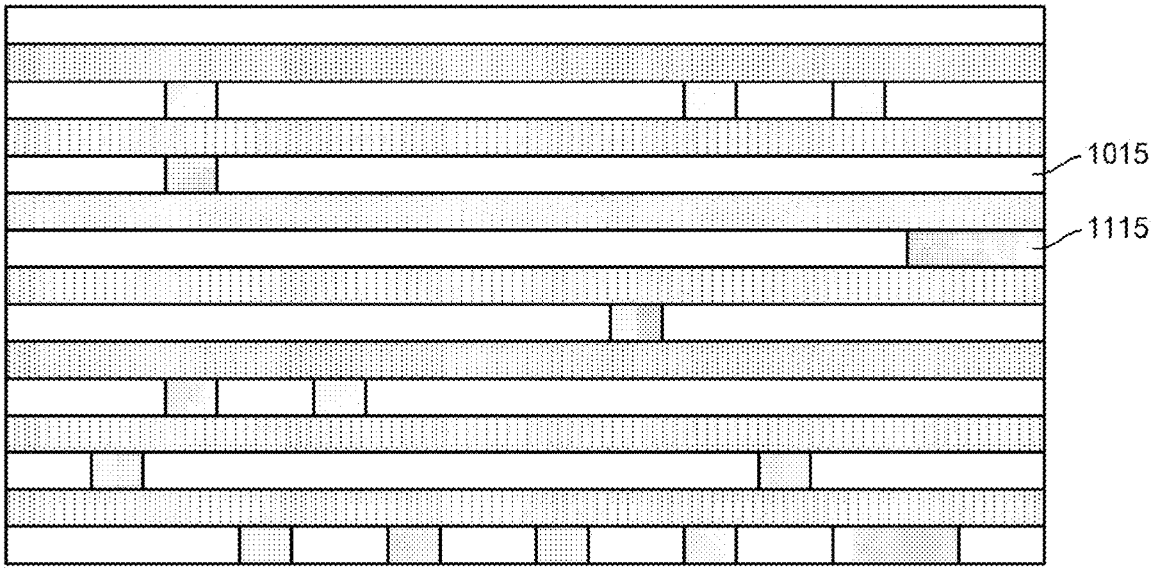
Figure 8B:
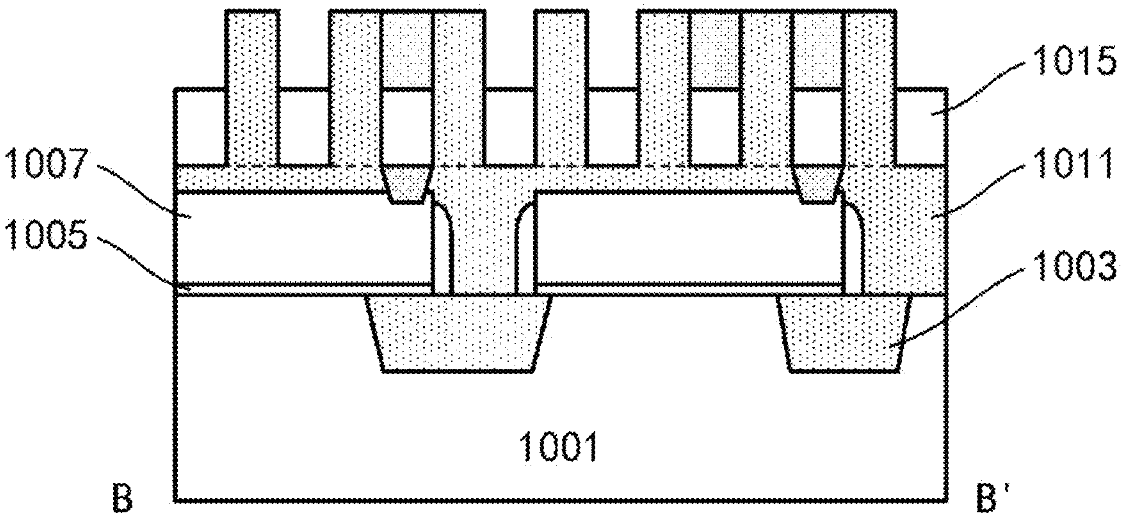
Figure 8C:
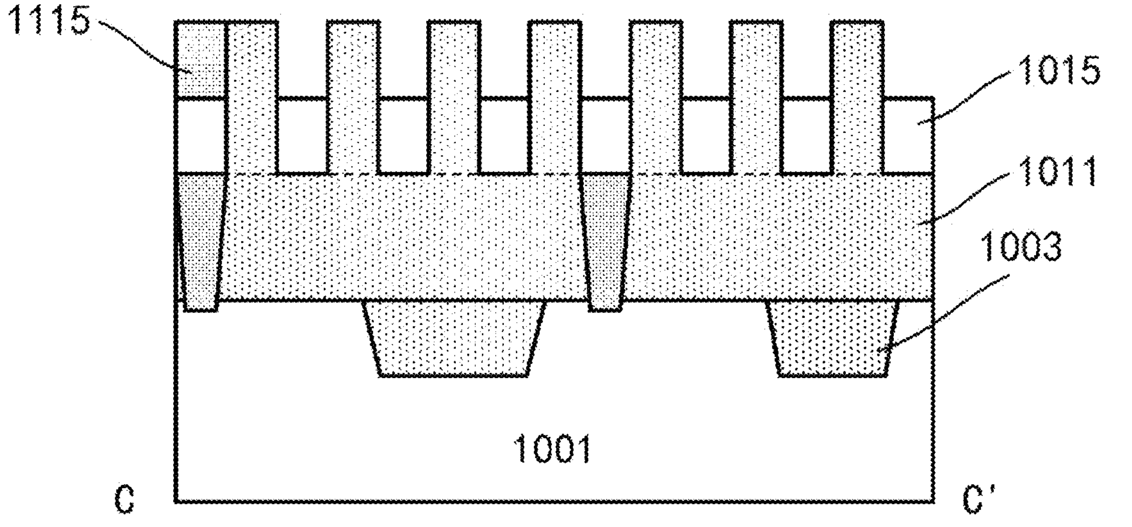

As shown in FIGS. 8A to 8C, the metal wire 1115 may be selectively etched, such as RIE, using the photoresist 1019 as an etching mask so as to form the via hole. According to an embodiment, an etching of the metal wire 1115 may have an etching selectivity with respect to the metal wire 1015, and thus may stop at a top surface of the metal wire 1015. The present disclosure is not limited thereto, and an endpoint detection may also be used to determine whether the etching reaches the top surface of the metal wire 1015 or not. In this way, the metal wire 1115 may be formed as some separate patterns (a via hole in the first via hole layer may be formed, see a top view of FIG. 8A). Then, the photoresist 1019 may be removed.

As via holes are obtained from lines formed by photolithography, the minimum spacing between the via holes may be defined (e.g., equal) by the minimum line spacing achievable by the photolithography process. The minimum spacing between the via holes formed by photolithography is greater than the minimum spacing between the lines.

In addition, the metal wire 1015 used for the first interconnection line layer currently remains continuously extended. They may be separated into multiple parts according to a design layout.

Figure 9:
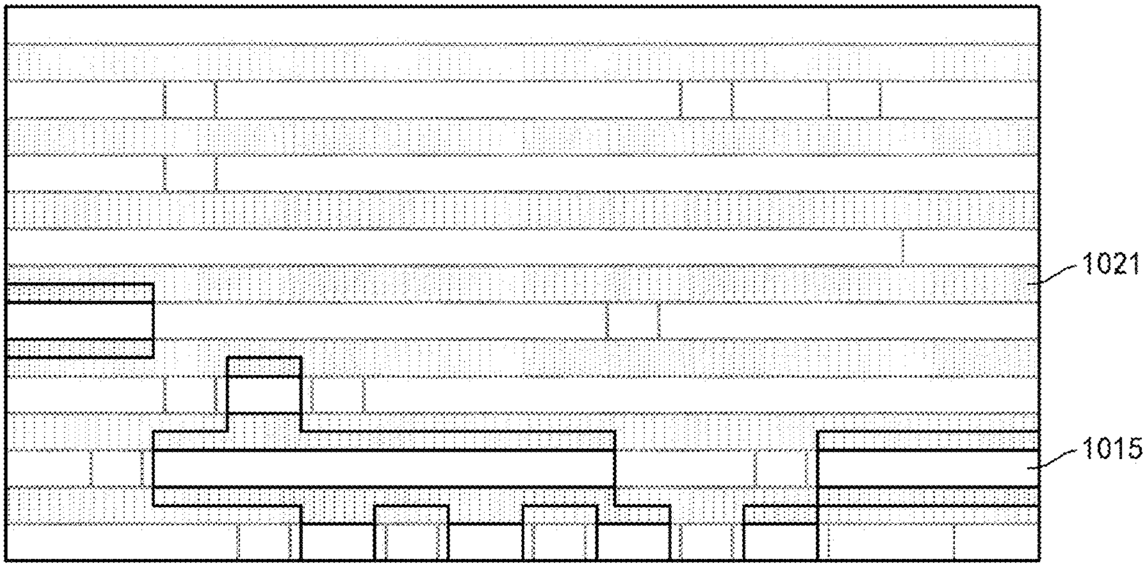

As shown in FIG. 9, a photoresist 1021 may be formed on the interlayer dielectric layer 1011 and the metal wires 1015 and 1115, and the photoresist 1021 is patterned to cover a region where an interconnection line exists in the pattern of the first interconnection layer, and expose a region where an interconnection line does not exist in the pattern of the first interconnection layer.

As shown in FIG. 10A to 10D, the metal wire 1015 may be selectively etched, such as RIE, using the photoresist 1021 as an etching mask. An etching of the metal wire 1015 may be stopped at the interlayer dielectric layer 1011 below to cut the metal wire 1015. Thus, in the first interconnection line layer, the metal wire 1015 may form some separate metal line segments, to obtain corresponding interconnection lines. Then, the photoresist 1021 may be removed.

In the above example, the via hole in the first via hole layer is patterned (etching of the metal wire 1115) and then the interconnection line in the first interconnection line layer is patterned (etching of the metal wire 1015). This is advantageous because an etching depth of each etching process is reduced. However, the present disclosure is not limited thereto. For example, an order of the two patterning processes may be exchanged.

Figure 10A:
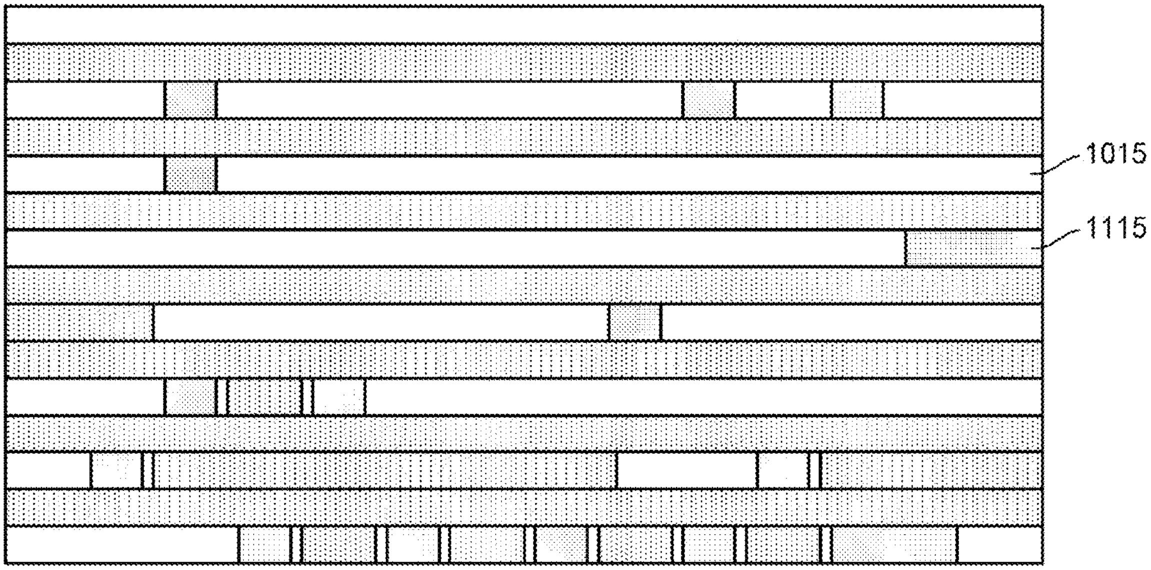
Figure 10B:
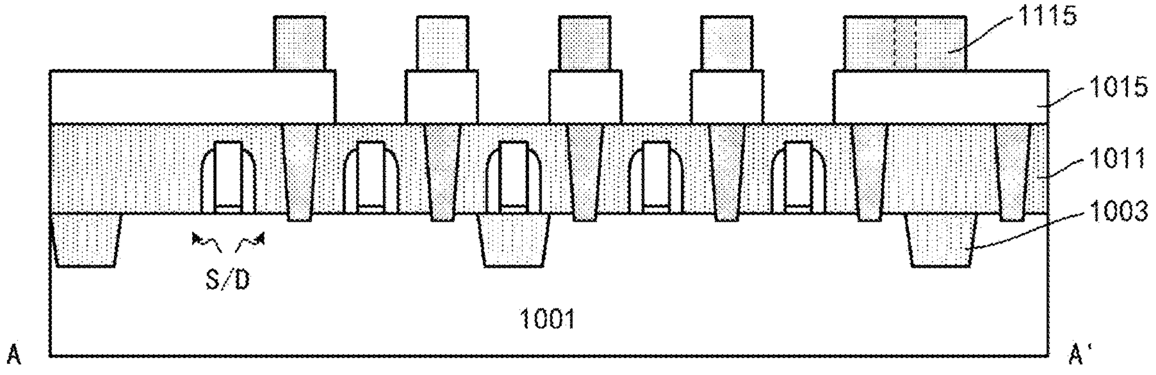

As shown in FIG. 10B, the metal wire 1015 extends on the interlayer dielectric layer 1011 to form the interconnection line; the metal wire 1115 is patterned into a localized pattern on the interconnection line to form the via hole. As the metal wires 1015 and 1115 may be formed by the same photolithography process (and then subjected to further cutting processes to form the interconnection line and the via hole, respectively), the interconnection line 1015 and the via hole 1115 may be self-aligned to each other.

In addition, as shown by a dashed line in the via hole 1115 on the rightmost side in FIG. 10B, for adjacent via holes on the same interconnection line, a metal wire thickness between them may not be reduced without causing an incorrect electrical connection between upper-level interconnection lines. That is, widths of the adjacent via holes are increased to be integrally connected to each other. In this way, a connection resistance may be reduced.

Figure 10C:
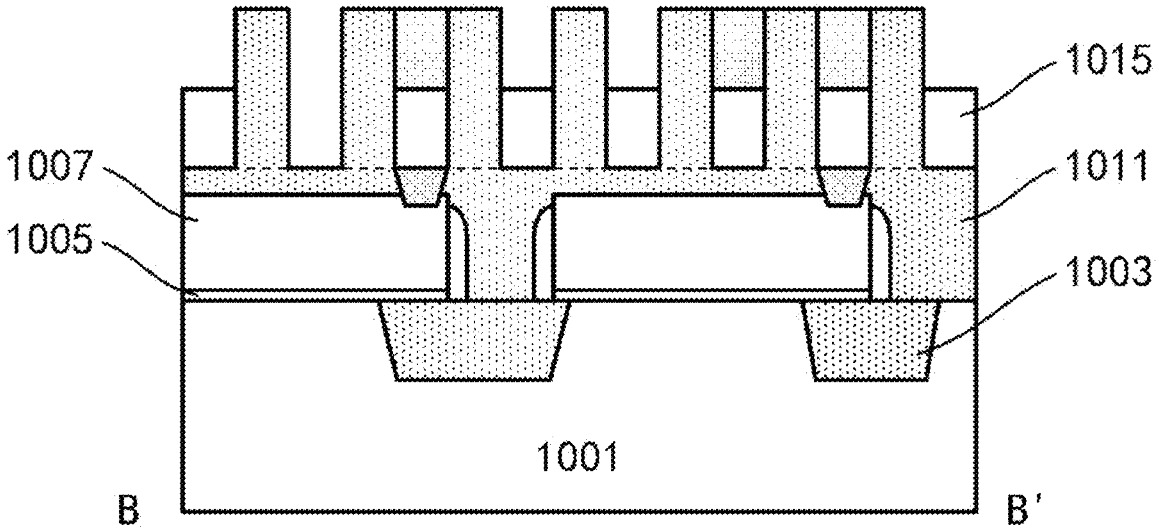
Figure 10D:
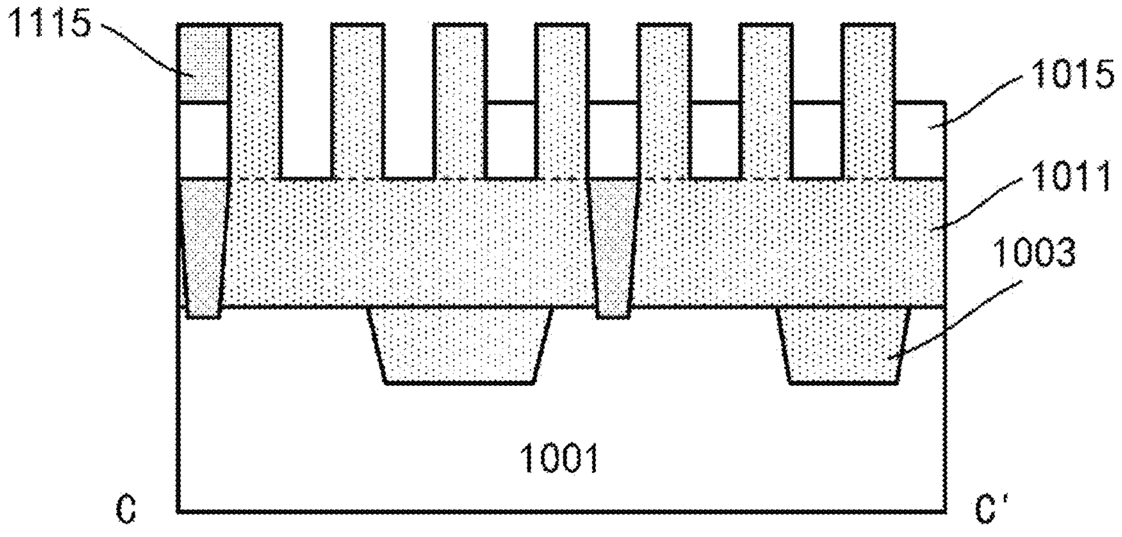
Figure 11A:
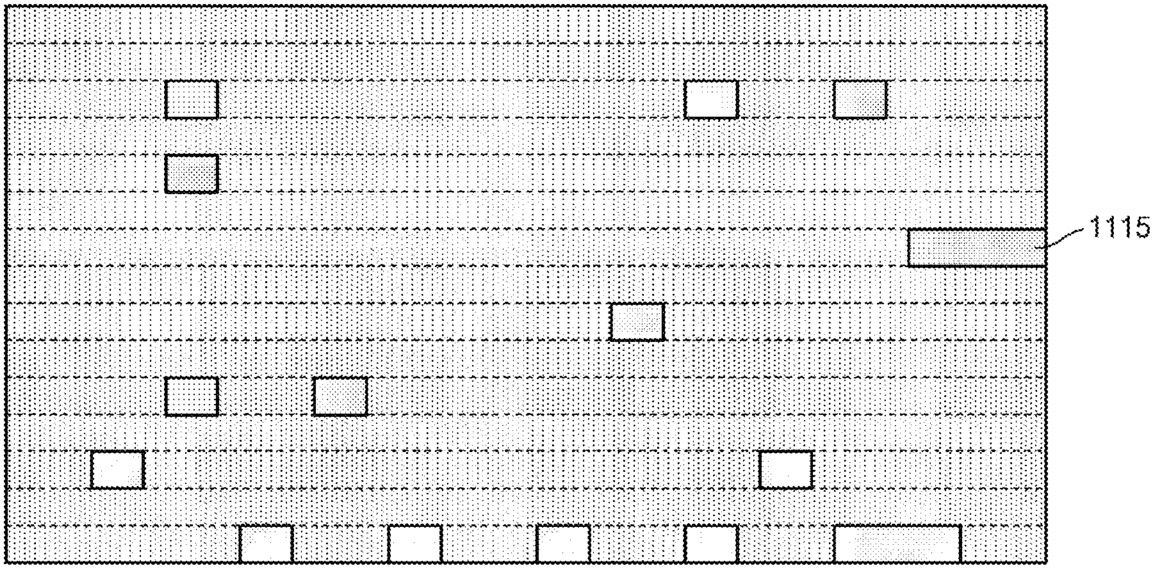
Figure 11B:
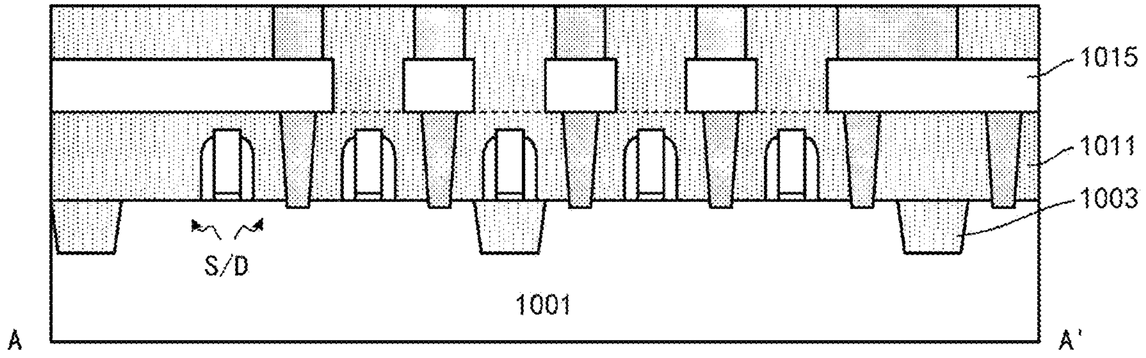
Figure 11C:
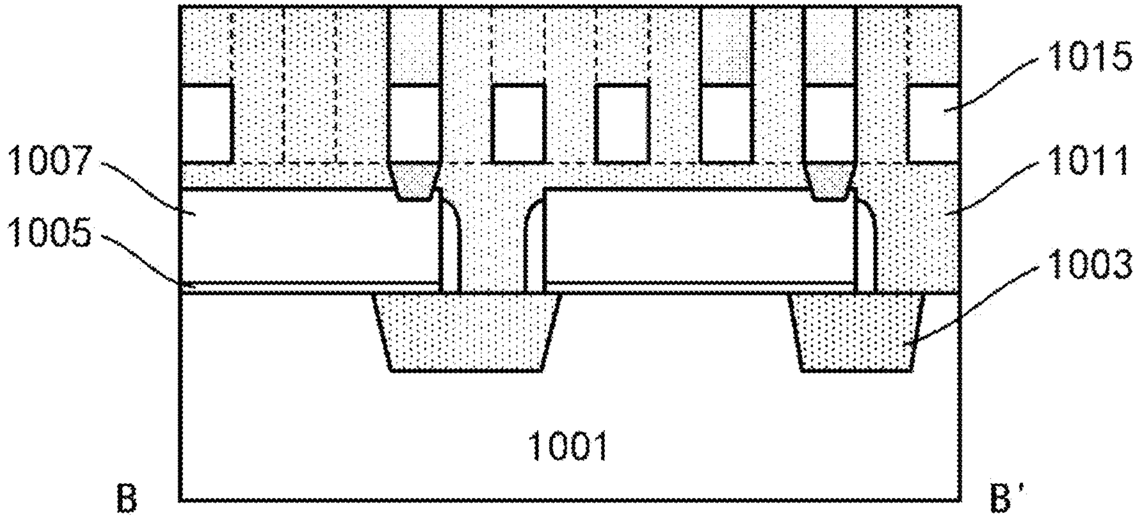
Figure 11D:
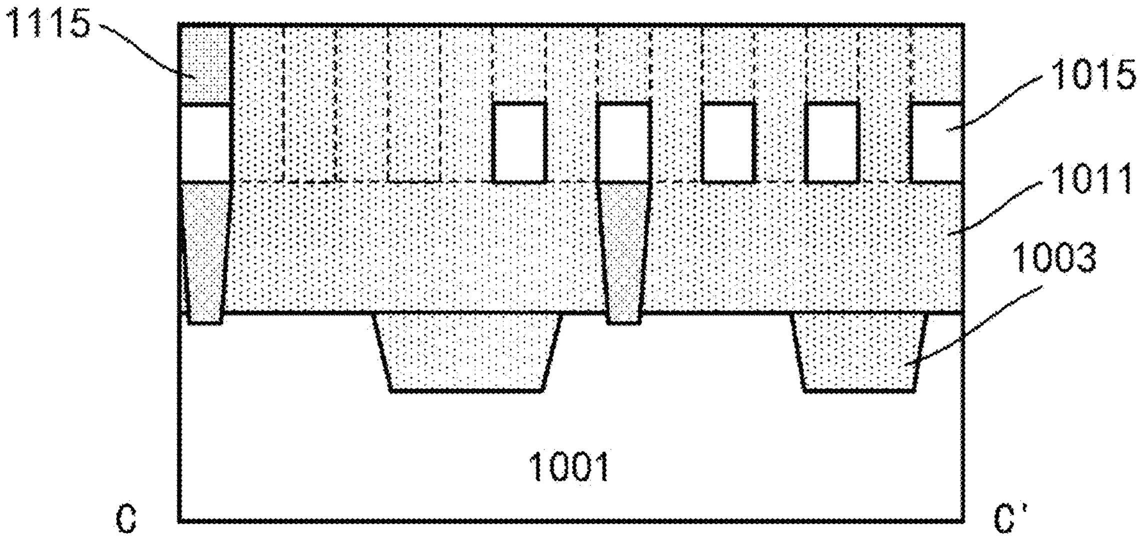

In addition, as shown in FIG. 10B, the via hole 1115 may be located in a local region of the interconnection line in a longitudinal extension direction of the interconnection line 1015 (a horizontal direction on the paper in FIG. 10B), for example, a sidewall of the via hole is indented with respect to a corresponding sidewall of the interconnection line. In addition, as shown in FIGS. 10C and 10D, in a cross section perpendicular to the longitudinal extension direction of the interconnection line 1015, a sidewall of the via hole 1115 may be substantially coplanar with a corresponding sidewall of the interconnection line.

Due to the above etching of the metal wires 1015 and 1115, spaces are formed in the interlayer dielectric layer 1011. As shown in FIGS. 11A to 11D, these spaces may be filled with a dielectric material. This may be done by the deposition followed by etching back or planarization as described above. The deposited dielectric material may be the same as or different from the previous interlayer dielectric layer 1011. The deposited dielectric material and the previous interlayer dielectric layer are still shown as 1011 as a whole, with a possible boundary therebetween schematically shown in a dashed line. According to other embodiments, before the dielectric material is deposited, a thin layer may be formed by, for example, deposition, for the purposes of diffusion barrier, protection, or etch stop.

Figure 12A:
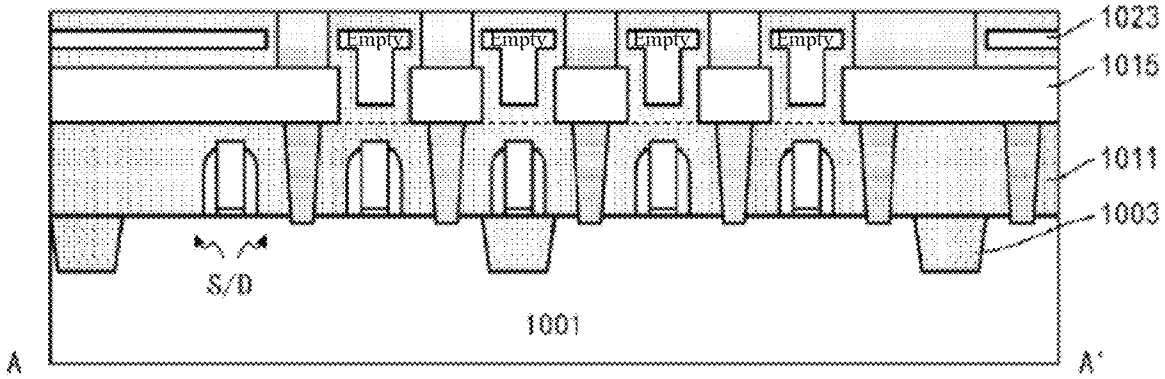
Figure 12B:
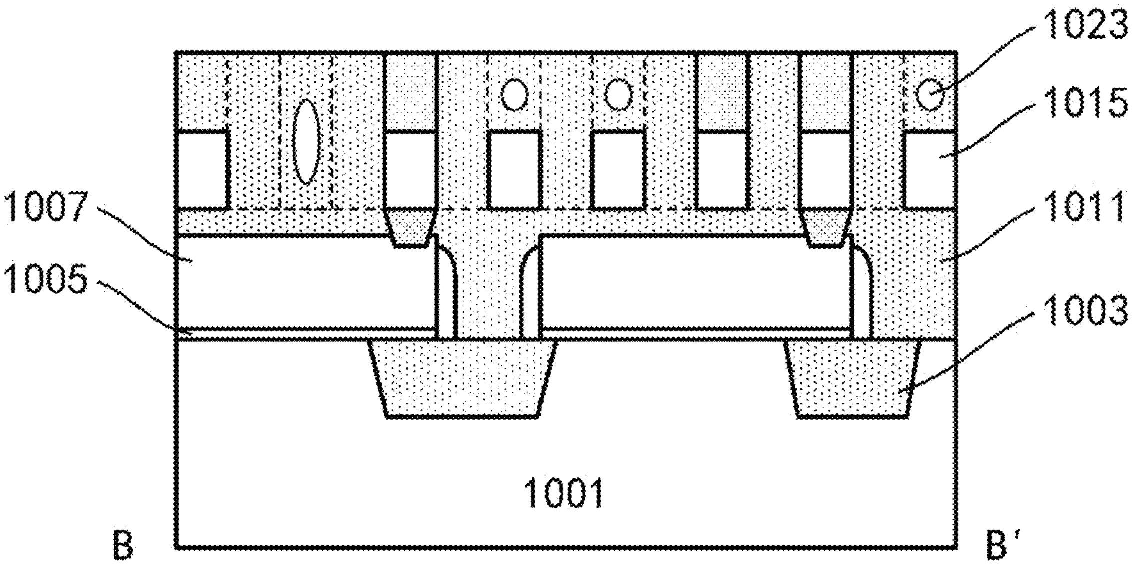
Figure 12C:
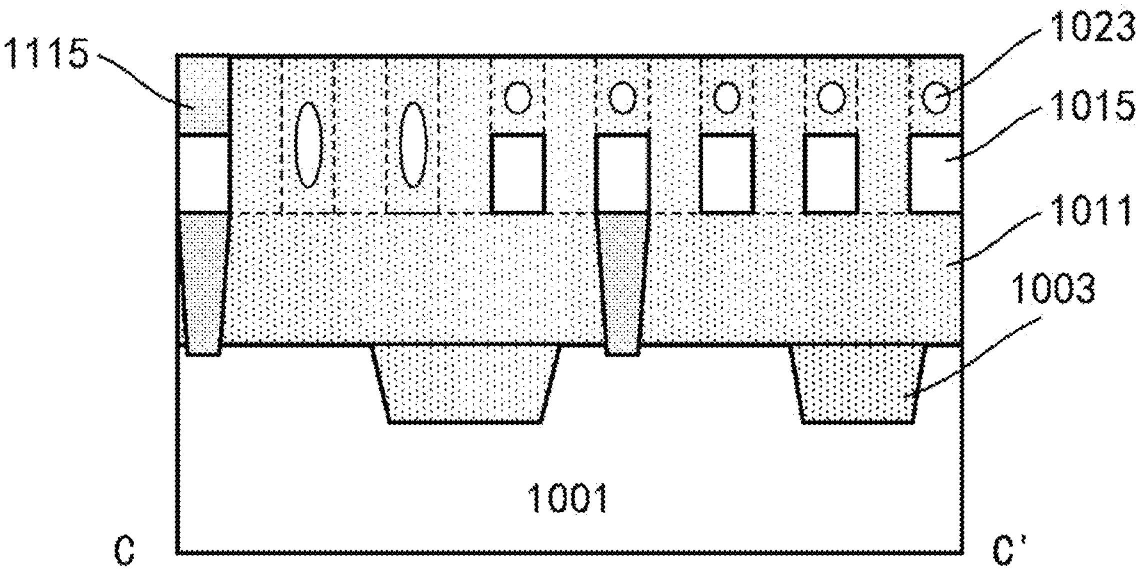

Similarly, as described above, since the gap to be filled is small, an air gap or void 1023 may be formed when the dielectric material is deposited, as shown in FIGS. 12A to 12C. The air gap or void 1023 may be different according to a shape of a corresponding gap. In addition, as described above, the position of the air gap or void 1023 in the vertical direction may be adjusted by adjusting a deposition process.

Figure 13A:
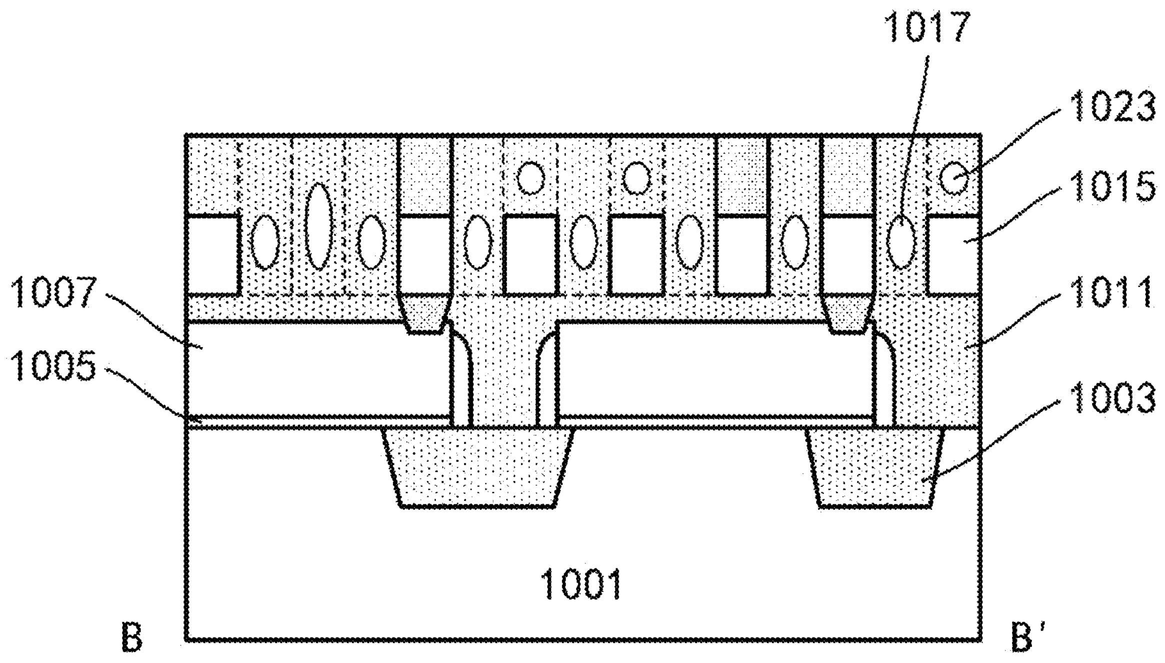
Figure 13B:
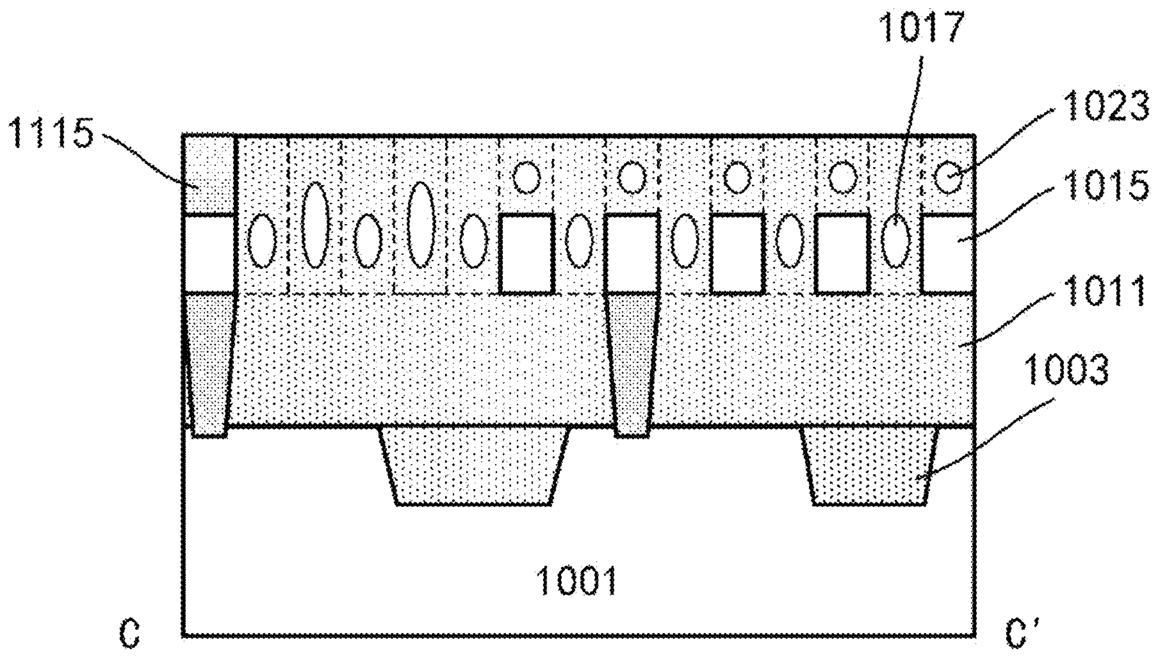

In addition, FIGS. 13A and 13B show a case that air gaps or voids are formed when filling the gaps in the interlayer dielectric layer twice. That is, in the examples shown in FIGS. 13A and 13B, the above-mentioned air gap or void 1017 and the air gap or void 1023 are combined.

Through the above-mentioned processes, the first interconnection line layer and the first via hole layer are formed. Next, various interconnection line layers and via hole layers in an upper layer of the metallization stack may be formed continuously in the same manner.

However, the present disclosure is not limited thereto. Hereinafter, a manufacturing method according to another embodiment of the present disclosure will be described in combination with the second interconnection line layer and a second via hole layer. The methods described below may be used alone or in combination with the methods described above.

As shown in FIGS. 14A to 14D, as described above in combination with FIG. 2, a third metal layer 1025 used for the second interconnection line layer in the metallization stack and a fourth metal layer 1125 used for the second via hole layer in the metallization stack may be formed. Metal materials of the third metal layer 1025 and the fourth metal layer 1125 may be the same as or different from those of the first metal layer 1015 and the second metal layer 1115. For example, the third metal layer 1025 may include the same material as the first metal layer 1015, such as Ru, and the fourth metal layer 1125 may include the same material as the second metal layer 1115, such as Mo. Similarly, the third metal layer 1025 may have a thickness, for example, in a range of about 5 nm to 100 nm, for the second interconnection line layer; the fourth metal layer 1125 may have a thickness, for example, in a range of about 5 nm to 100 nm, for the second via hole layer.

Then, as described above in combination with FIGS. 3A to 3C, the third metal layer 1025 and the fourth metal layer 1125 may be patterned into a series of metal wires. In this example, instead of patterning the third metal layer 1025 and the fourth metal layer 1125 into metal wires that extend continuously, the third metal layer 1025 and the fourth metal layer 1125 may be patterned directly according to a pattern of the second interconnection line layer. Thus, the third metal layer 1025 and the fourth metal layer 1125 may be patterned into a series of metal line segments. That is, the metal wire cutting process described above in combination with FIG. 9 and FIGS. 10A to 10D is combined to be performed together with a metal layer patterning, such that a separate cutting photolithography process is not required. In addition, due to this patterning, the metal line segment may not be limited to a straight line segment, but may include a zigzag line segment. A metal line segment 1025 then forms an interconnection line in the second interconnection line layer.

Figure 14A:
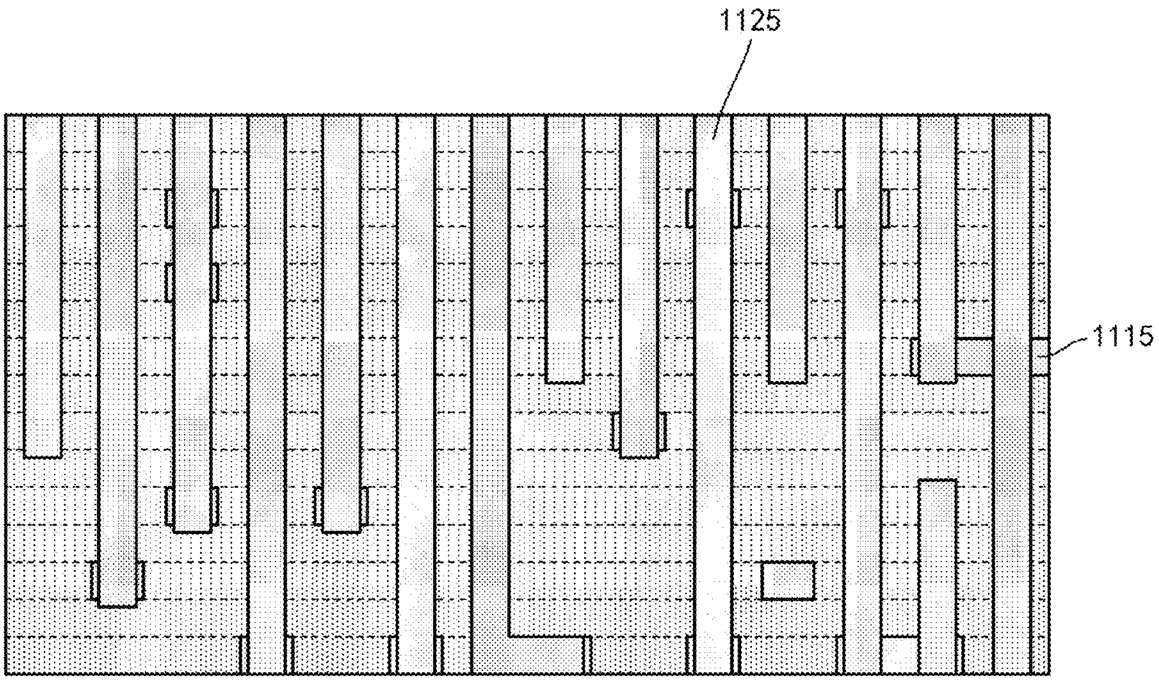
Figure 14B:
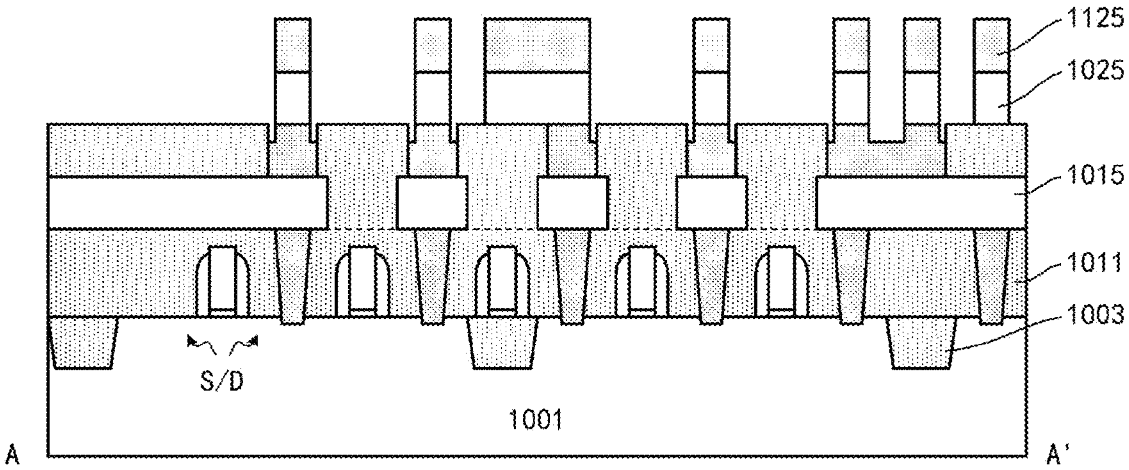
Figure 14C:
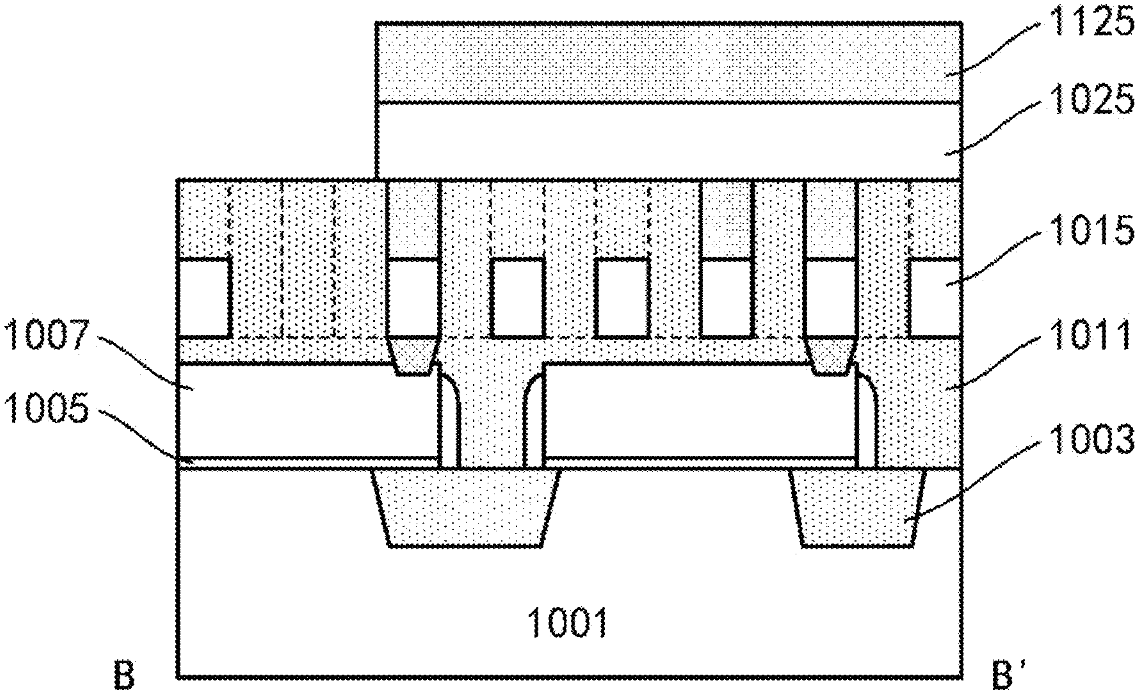
Figure 14D:
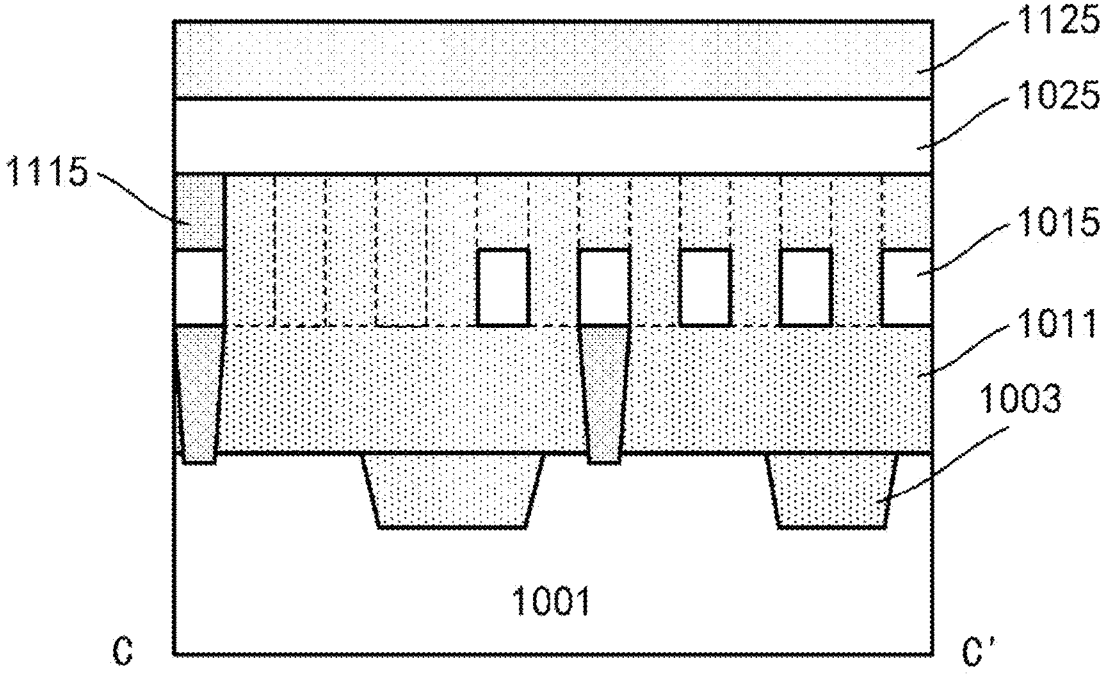

In addition, when the third metal layer 1025 and the fourth metal layer 1125 are etched, an over-etching of the via hole 1115 below may occur. Thus, as shown in FIG. 14B, a width of an upper portion of the via hole 1115 in the first via hole layer may be reduced and be approximately the same as a line width of the metal line segment 1025 formed thereon. In addition, as shown in FIG. 14B, a line width W2 of the metal line segment 1025 (a dimension in a horizontal direction on the paper in FIG. 14B) may be relatively small, and smaller than the width W1 (a dimension in the horizontal direction on the paper in FIG. 14B) of the via hole in the first via hole layer (regardless of an upper portion thereof, a width of which may be reduced due to the above over-etching), such that the metal line segment 1025 (which subsequently forms the interconnection line in the second interconnection line layer) may land better on the via hole so as to better contact the via hole.

Another interlayer dielectric layer may be formed on the interlayer dielectric layer 1011 to fill a gap between the metal line segments 1025 and 1125. The another interlayer dielectric layer may include a dielectric material such as silicon oxide, silicon oxycarbide, other low-k dielectric materials, and the like.

The another interlayer dielectric layer is formed as follows.

Figure 15A:
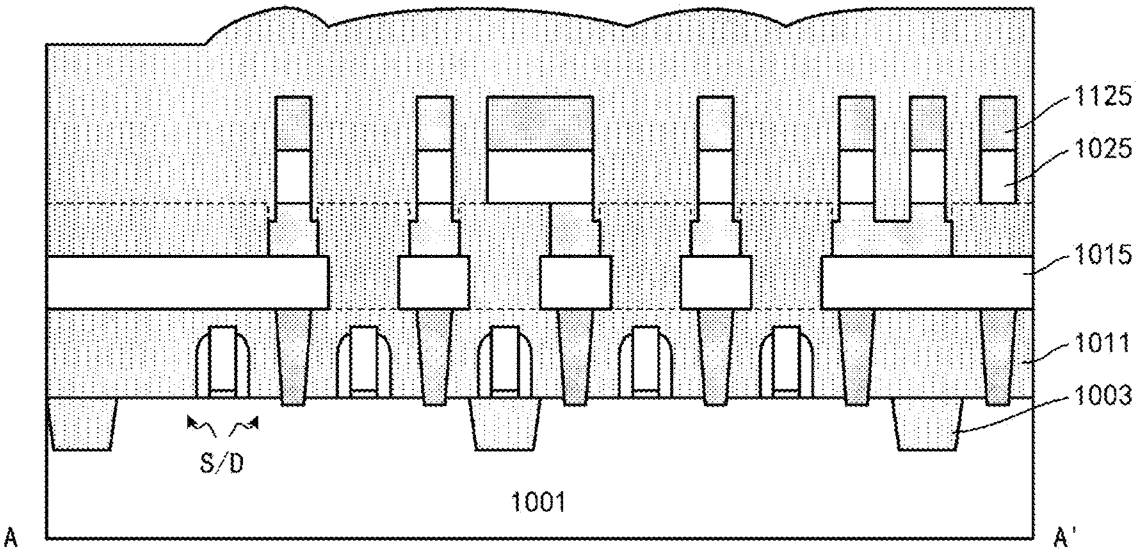

As shown in FIG. 15A, the dielectric material may be deposited (e.g., CVD or ALD) to cover the metal line segments 1025 and 1125. The deposited dielectric material and the previous interlayer dielectric layer 1011 may include the same material, and thus they may be shown as 1011 as a whole, with a possible boundary therebetween schematically shown in a dashed line. Alternatively, the deposited dielectric material and the previous interlayer dielectric layer 1011 may also include different materials.

Figure 15B:
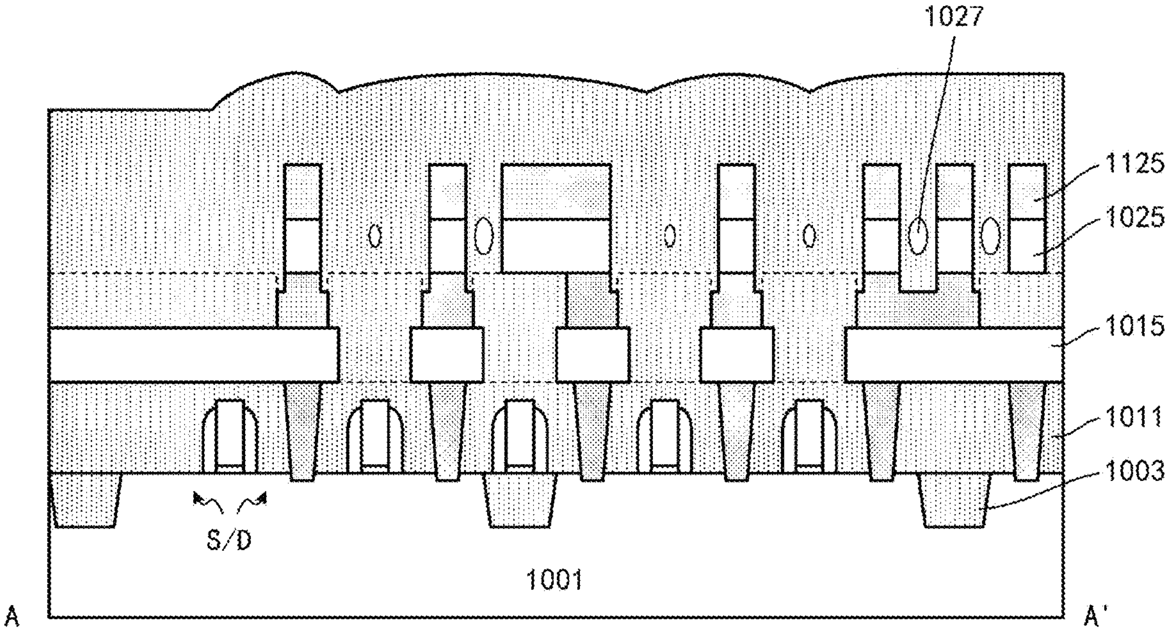

Alternatively, as described above, an air gap or void 1027 may be formed between the metal line segments 1025 and 1125 when the dielectric material is deposited, as shown in FIG. 15B. In this example, since the metal line segments have the pattern of the second interconnection line layer, a density of the metal line segments in some regions may be low, or a gap between the metal line segments may be large. In these regions, it is difficult to form an air gap or void.

Figure 16:
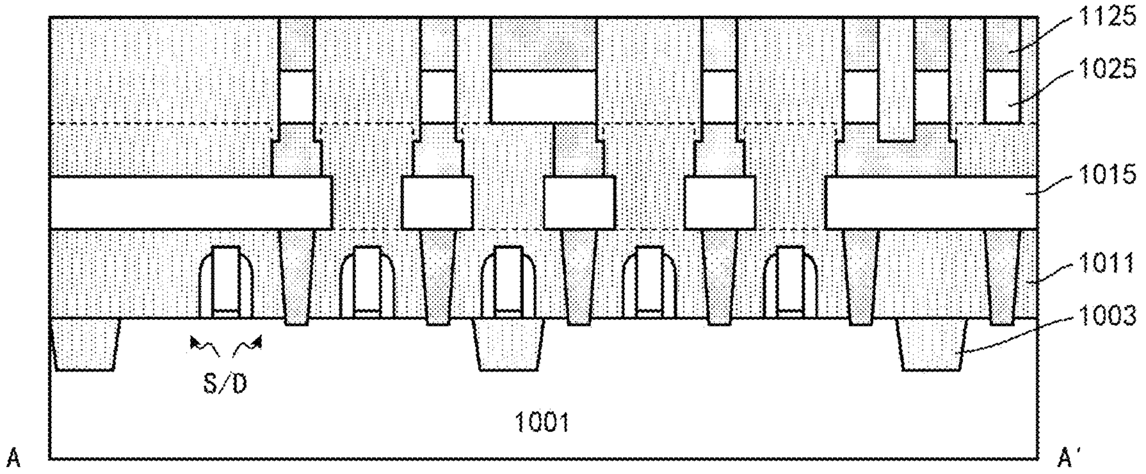

Then, as shown in FIG. 16, the deposited dielectric material may be etched back or planarized by, for example, CMP, and stopped on a top surface of the metal line segment 1125. The etching back may use ALE to achieve good process control.

Then, a via hole in the second via hole layer may be formed by the metal line segment 1125 according to the processes described above in combination with FIGS. 7 and 8A to 8C. Then, a space in the interlayer dielectric layer 1011 may be filled with the dielectric material according to the processes described above in combination with FIGS. 11A to 11D. In this way, the second interconnection line layer and the second via hole layer are formed.

FIGS. 17 to 24D schematically show some stages in a process of manufacturing a metallization stack according to another embodiment of the present disclosure. Hereinafter, differences from the embodiments described above in combination with FIGS. 1 to 16 will be mainly described.

Figure 17:
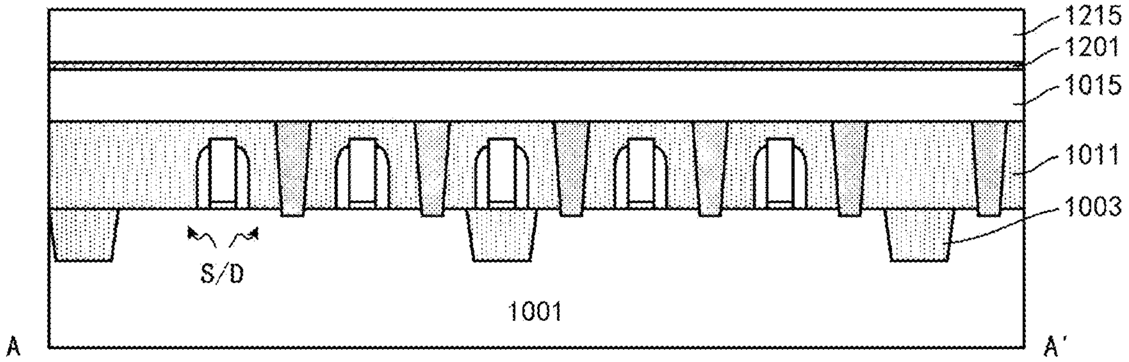

As shown in FIG. 17, the first metal layer 1015 used for the first interconnection line layer in the metallization stack and a second metal layer 1215 used for the first via hole layer in the metallization stack may be formed on the interlayer dielectric layer 1011, as described above with reference to FIG. 2. The first metal layer 1015 and the second metal layer 1215 may include the same material, such as Ru, but may include different materials, as described in the above embodiments. A difference from the above embodiments is that a spacer layer 1201 may be additionally provided between the first metal layer 1015 and the second metal layer 1215 by, for example, deposition. For example, the spacer layer 1201 may serve as a diffusion barrier layer or an etch stop layer between the first metal layer 1015 and the second metal layer 1215. For example, the spacer layer 1201 may include a conductive metal silicide such as NiSi, NiPtSi, CoSi, etc., or a conductive metal nitride such as TiN, TaN, etc., or a metal such as Ti, Pt, etc., with a thickness in a range of about 1 nm to 10 nm.

Figure 18A:
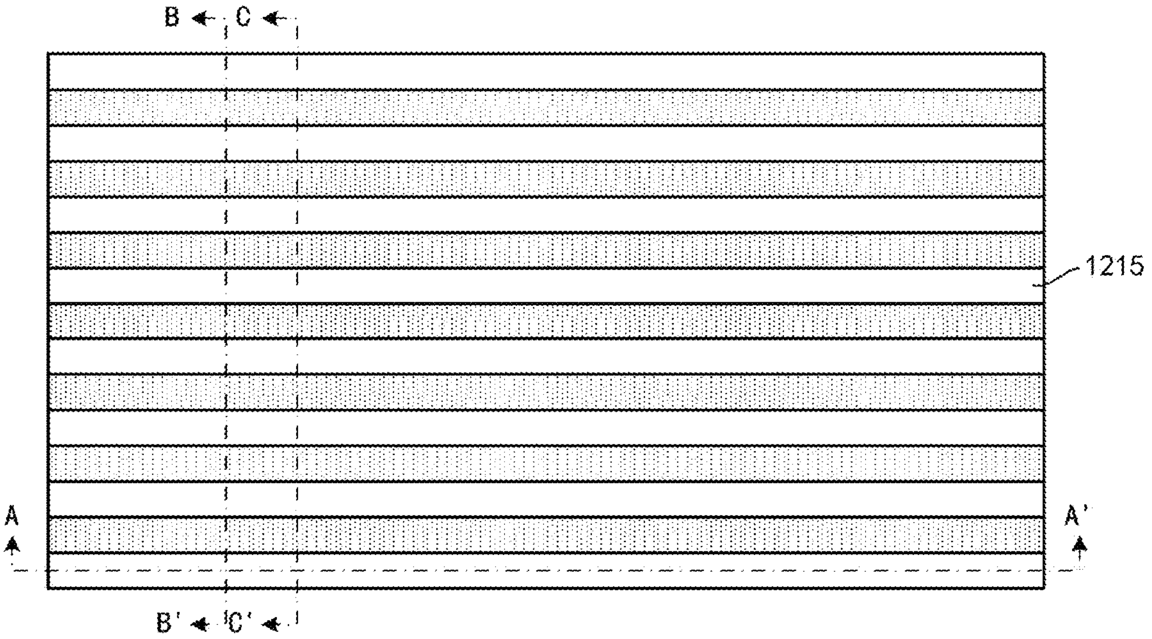
Figure 18B:
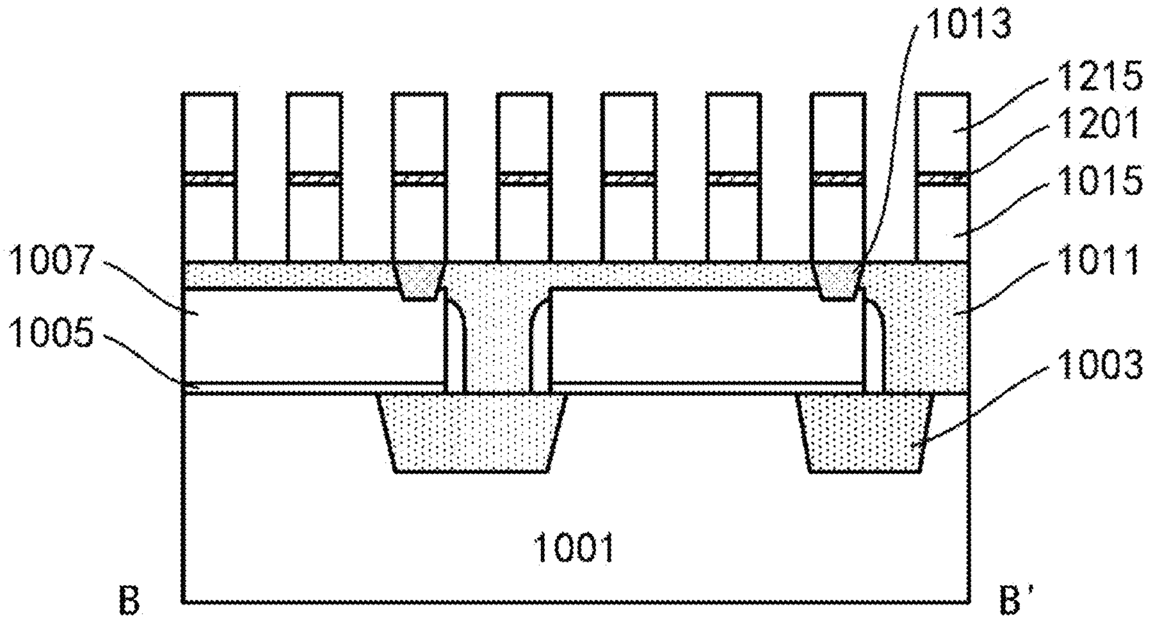
Figure 18C:
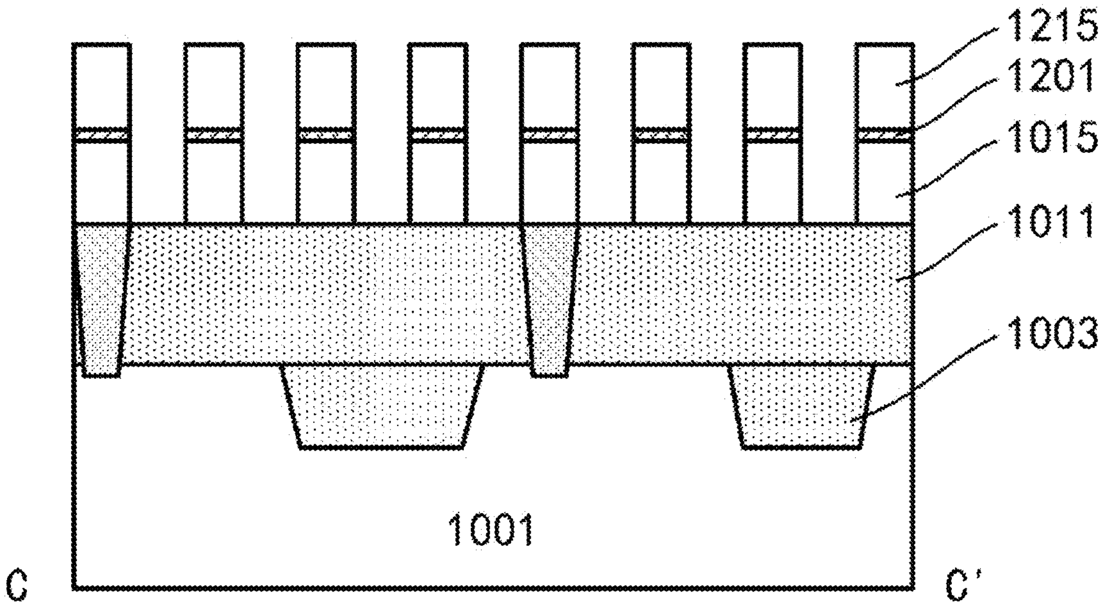

As shown in FIGS. 18A to 18C, the first metal layer 1015, the spacer layer 1201 and the second metal layer 1215 may be patterned into a series of line patterns, as described above with reference to FIGS. 3A to 3C.

Figure 19A:
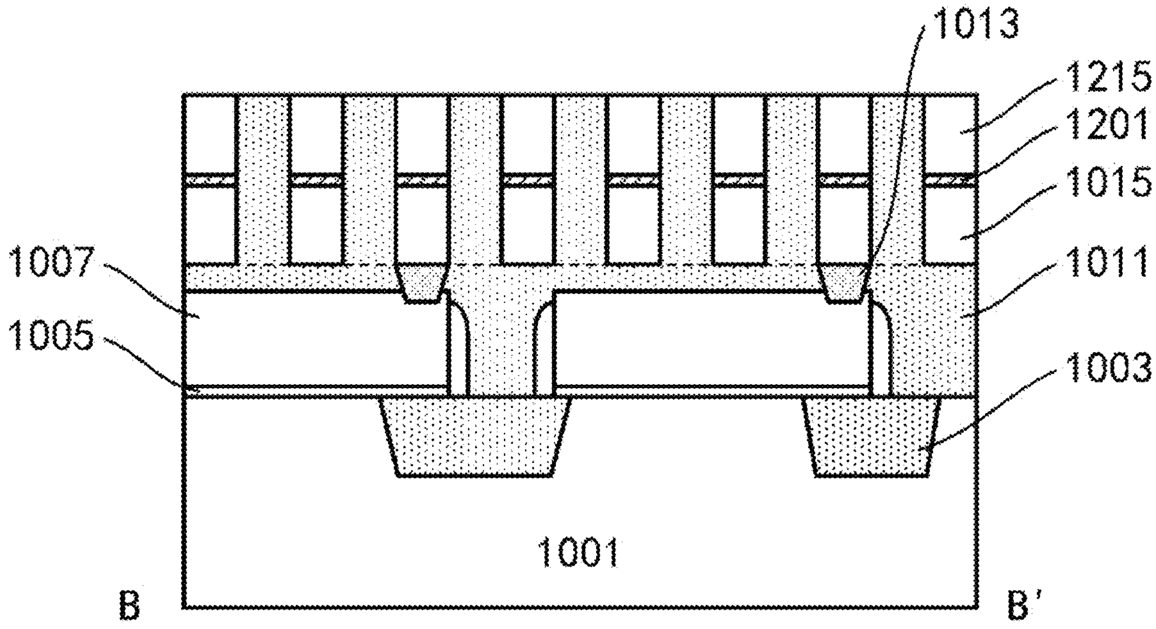
Figure 19B:
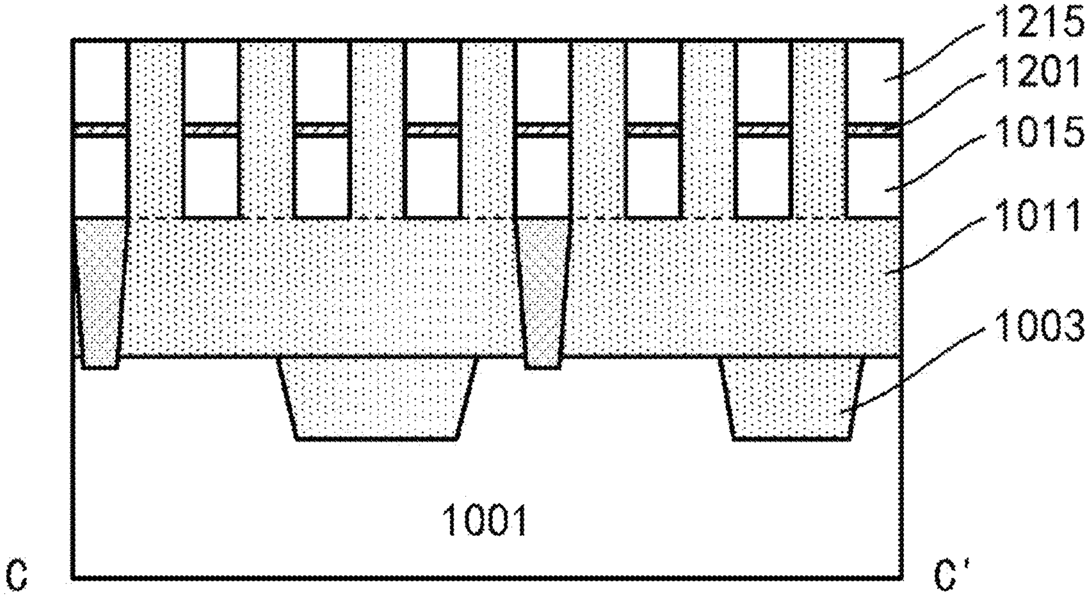
Figure 20A:
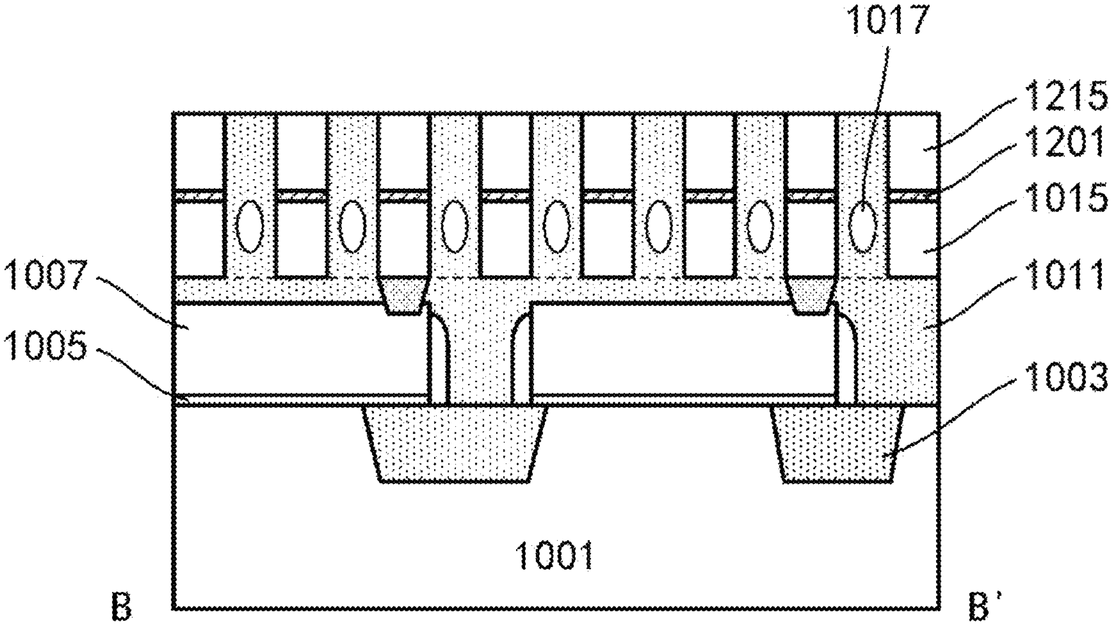
Figure 20B:
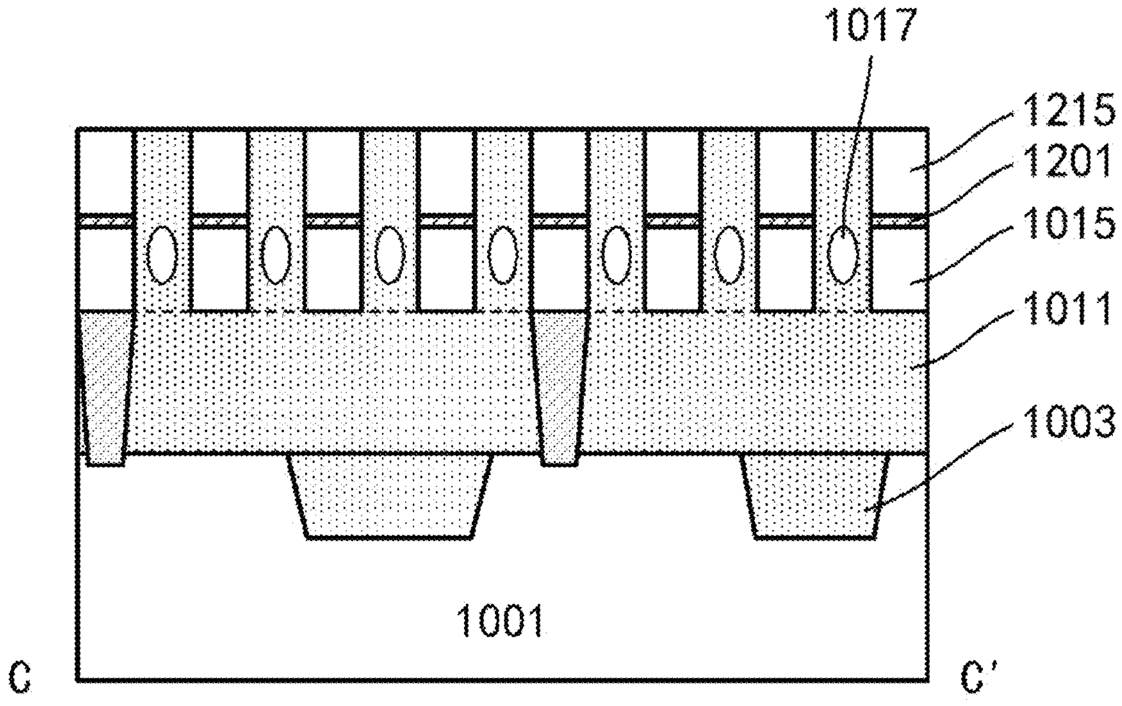
Figure 21:
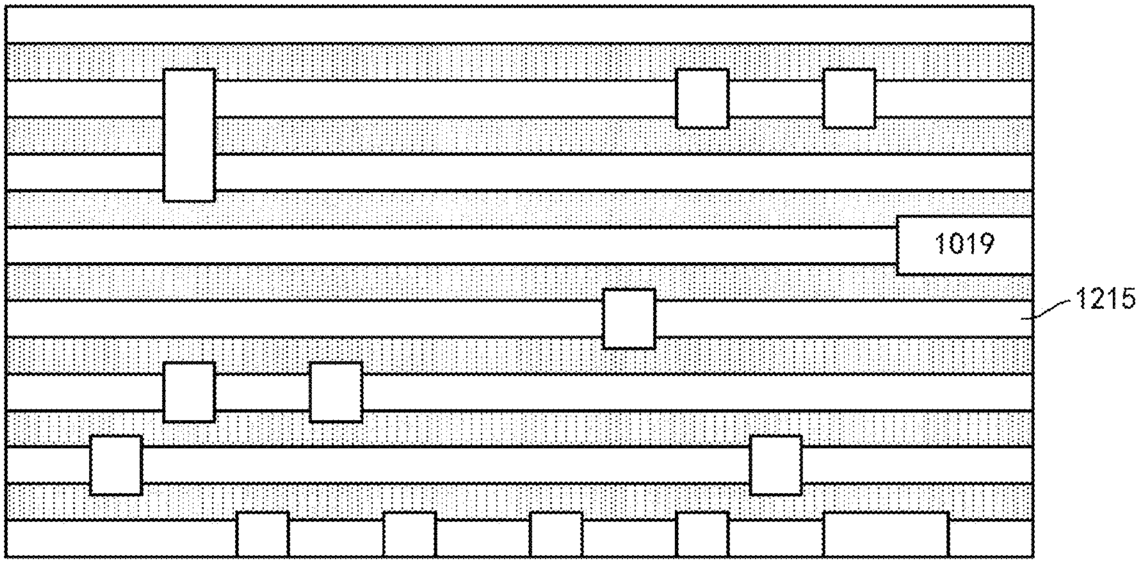
Figure 22A:
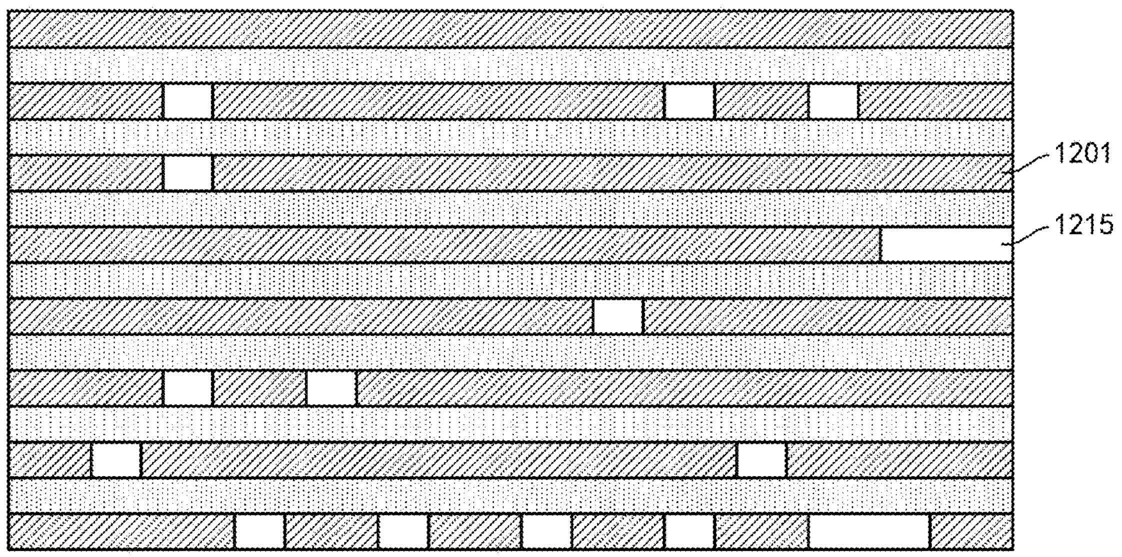
Figure 22B:
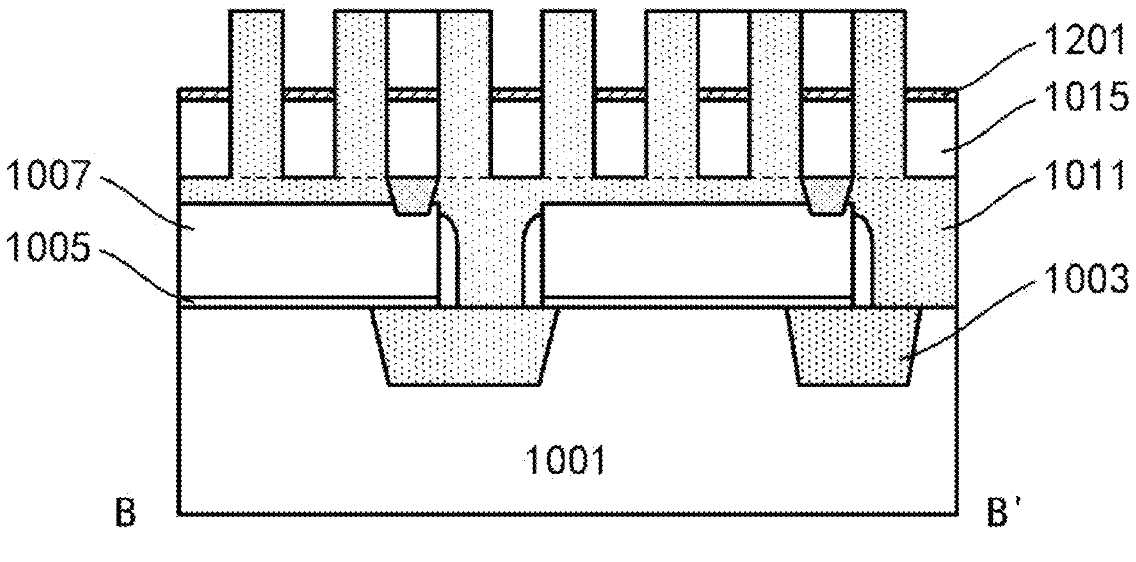
Figure 22C:
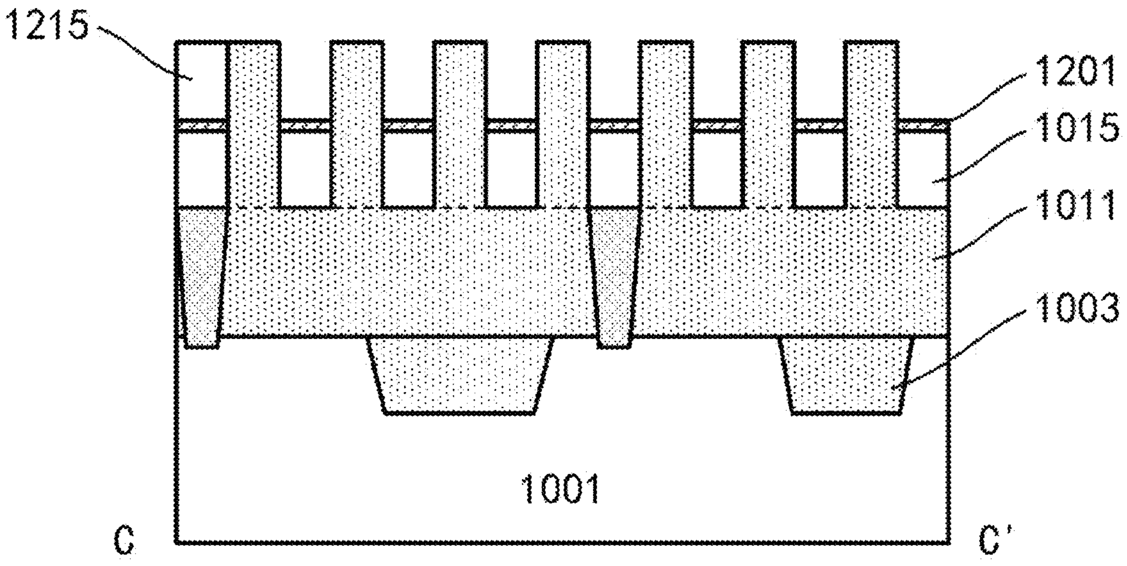
Figure 23:
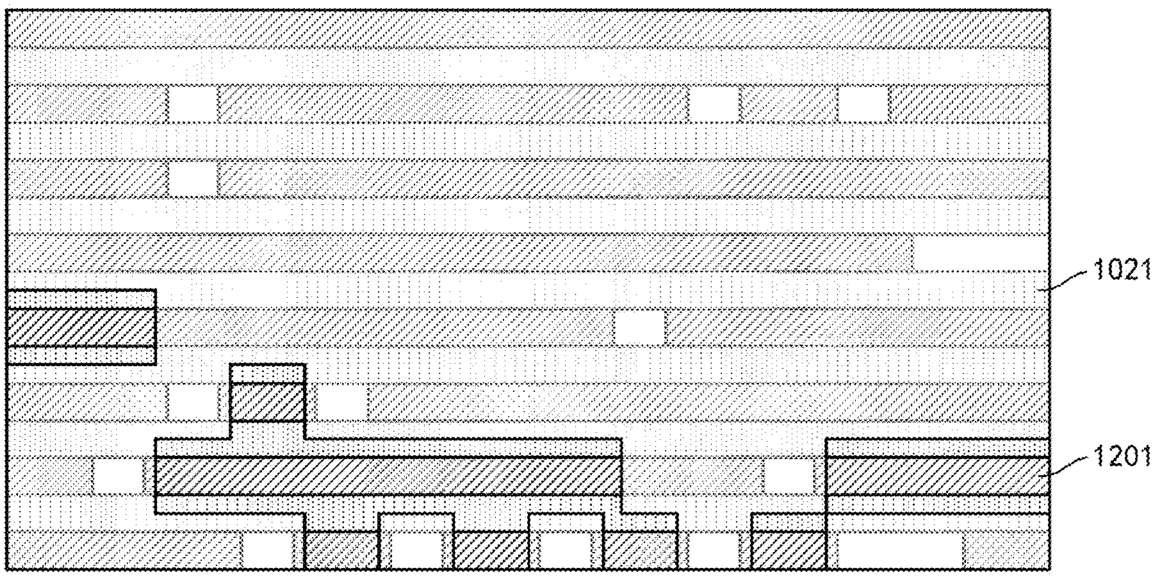
Figure 24A:
Figure 24B:
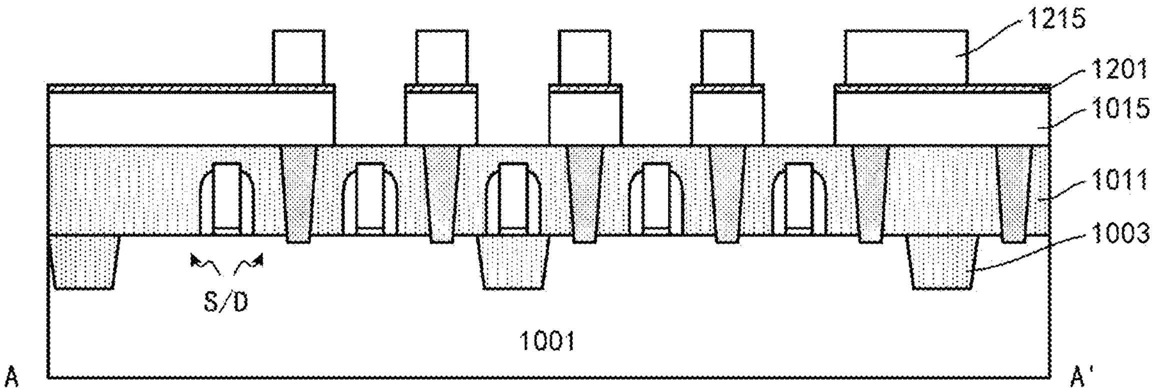
Figure 24C:
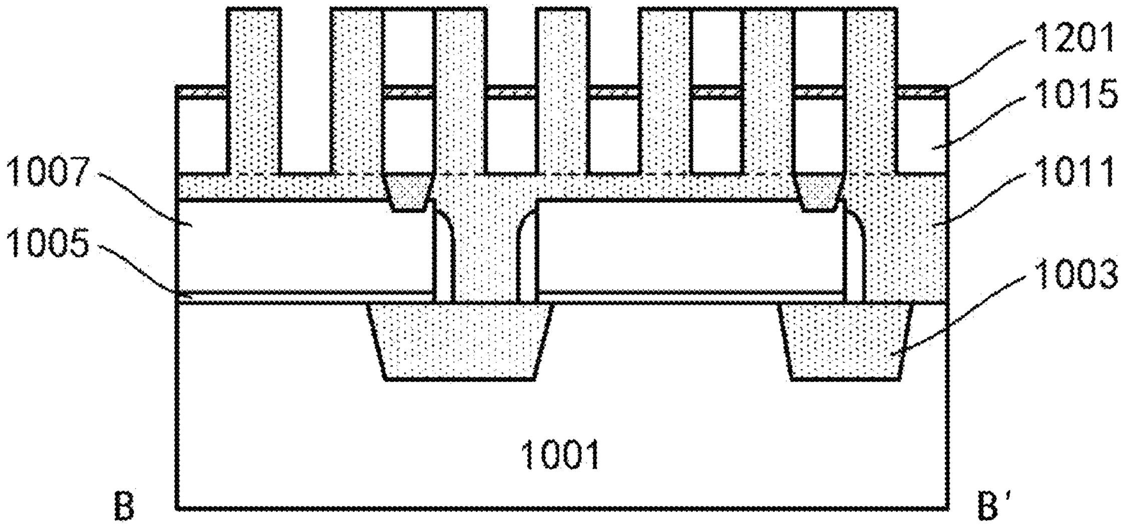
Figure 24D:
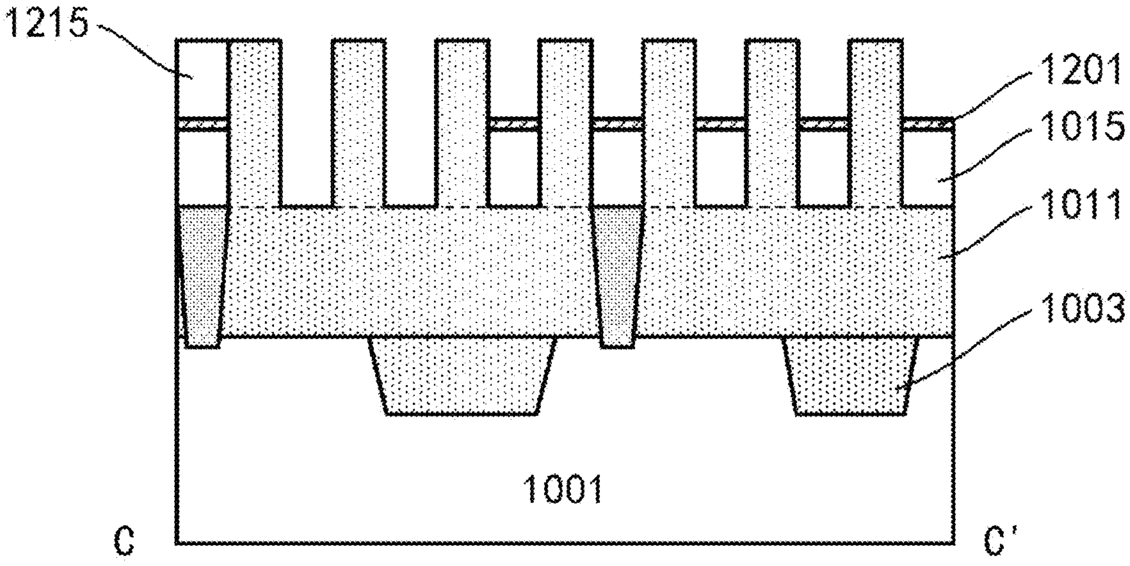

As shown in FIGS. 19A and 19B, an another interlayer dielectric layer may be formed on the interlayer dielectric layer 1011 to fill a gap between the line patterns, as described above with reference to FIGS. 4A and 4B. Similarly, the air gap or void 1017 may be formed, as shown in FIGS. 20A and 20B.

As shown in FIG. 21 and FIGS. 22A to 22C, the photoresist 1019 may be formed and the second metal layer 1215 may be selectively etched, e.g., RIE, to be patterned into a via hole, as described above with reference to FIG. 7 and FIGS. 8A to 8 C. The etching may stop at the spacer layer 1201.

As shown in FIG. 23 and FIGS. 24A to 24D, the photoresist 1021 may be formed, and the spacer layer 1201 and the first metal layer 1015 may be selectively etched, such as RIE, to form an interconnection line, as described above with reference to FIG. 9 and FIGS. 10A to 10D. As shown in FIGS. 24A to 24D, the spacer layer 1201 (e.g., serving as a diffusion barrier layer) may extend only on a bottom surface of the via hole 1215 or on a bottom surface of the interconnection line 1015, without extending onto a sidewall of the via hole 1215, which is different from a diffusion barrier layer formed by an existing process.

In addition, in the processes described above with reference to FIGS. 14A to 16, a spacer layer may also be combined between the third metal layer and the fourth metal layer. For the spacer layer, it may be used as an etch stop layer when the fourth metal layer is patterned, and the spacer layer itself may be patterned together with the third metal layer. Other aspects may be the same as the above embodiments.

According to embodiments of the present disclosure, the interconnect pattern may be formed by photolithography. Accordingly, a line width and a spacing of the interconnection line and a critical dimension (CD) and a spacing of the via hole may be determined by a line width or CD and a spacing of photolithography, such that the line width or CD and the spacing may be reduced, and thus an integration density may be increased. In addition, a difficult problem of metal filling in an existing process is avoided. Further, since a filling process is not used, a metal material such as ruthenium (Ru), molybdenum (Mo), rhodium (Rh), platinum (Pt), iridium (Ir), nickel (Ni), cobalt (Co), or chromium (Cr) may be used, and thus a diffusion barrier layer may not be necessary.

The metallization stack according to the embodiments of the present disclosure may be applied to various electronic devices. Therefore, the present disclosure further provides an electronic device including the above-mentioned metallization stack. The electronic device may further include a display screen, a wireless transceiver and other components. Such an electronic device may include, for example, a smart phone, a computer, a tablet computer (PC), a wearable smart device, a mobile power supply, and so on.

According to the embodiments of the present disclosure, a method of manufacturing a system on chip (SoC) is further provided, which may include the above-mentioned methods. Specifically, a variety of devices may be integrated on the chip, at least some of which are manufactured according to the methods of the present disclosure.

In the above description, the technical details such as patterning and etching of various layers have not been described in detail. However, those skilled in the art may understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A metallization stack, comprising:

at least one interconnection line layer and at least one via hole layer arranged alternately on a substrate, wherein at least one pair of adjacent an upper interconnection line layer and a via hole layer in the metallization stack comprises:

an upper interconnection line in the upper interconnection line layer; and a via hole in the via hole layer, wherein the via hole layer is arranged closer to the substrate than the upper interconnection line layer, wherein at least part of the upper interconnection line extends longitudinally in a first direction, and a sidewall of the at least part of the upper interconnection line in the first direction is substantially coplanar with at least an upper portion of a corresponding sidewall of the via hole under the at least part of the upper interconnection line, wherein the metallization stack further comprises:

a lower interconnection line layer that is closer to the substrate than the via hole layer and adjacent to the via hole layer, and wherein a part of a lower interconnection line in the lower interconnection line layer at least under the via hole extends longitudinally along a second direction intersecting the first direction, and a sidewall of the part of the lower interconnection line in the second direction is substantially coplanar with a lower portion of a corresponding sidewall of the via hole.

2. The metallization stack according to claim 1, wherein a width of the upper portion of the via hole in the second direction is less than a width of the lower portion of the via hole in the second direction.

3. The metallization stack according to claim 1, further comprising:

a first dielectric layer filled between via holes in the via hole layer, wherein a part of a sidewall of the first dielectric layer is self-aligned with a sidewall of a corresponding lower interconnection line in the lower interconnection line layer.

4. The metallization stack according to claim 3, further comprising:

a second dielectric layer filled between lower interconnection lines in the lower interconnection line layer, wherein the second dielectric layer further extends to a part of a space between the via holes in the via hole layer, the first dielectric layer fills a remaining part of the space between the via holes in the via hole layer, and the part of the sidewall of the first dielectric layer is an interface between the first dielectric layer and the second dielectric layer.

5. The metallization stack according to claim 1, wherein a material of the upper interconnection line is different from a material of the via hole.

6. The metallization stack according to claim 1, wherein the upper interconnection line and the via hole comprise a metal and are in direct contact with a surrounding dielectric layer.

7. The metallization stack according to claim 6, wherein the metal comprises ruthenium Ru, molybdenum Mo, rhodium Rh, platinum Pt, iridium Ir, nickel Ni, cobalt Co, or chromium Cr.

8. The metallization stack according to claim 1, wherein a minimum spacing between via holes is defined by a minimum line spacing implemented by a photolithography process.

* * * * *